United States Patent [19]
Fuller

[11] Patent Number: 5,694,077
[45] Date of Patent: Dec. 2, 1997

[54] REDUCED PHASE-SHIFT NONLINEAR FILTERS

[75] Inventor: James W. Fuller, Amston, Conn.

[73] Assignee: United Technologies Corporation, Hartford, Conn.

[21] Appl. No.: 673,634

[22] Filed: Jun. 26, 1996

[51] Int. Cl.$^6$ ...................................................... H03K 5/00
[52] U.S. Cl. ........................... 327/552; 327/556; 327/557; 327/558; 327/559; 330/306
[58] Field of Search ................................ 327/551, 552, 327/553, 554, 555, 556, 557, 558, 559, 311; 330/294, 107, 306

[56] References Cited

U.S. PATENT DOCUMENTS 5,440,270   8/1995   Sevastopoulos et al. ............... 330/107

OTHER PUBLICATIONS

Arthur Gelb et al, "Multiple–Input Describing Functions and Nonlinear System Design," McGraw–Hill Book Company, 1968, pp. 79–81.
Isaac Horowitz et al., "Non–linear design for cost of feedback reduction in systems with large parameter uncertainty." Int. J. Control, 1975, vol. 21, No. 6, pp. 977–1001.

Primary Examiner—Timothy P. Callahan
Assistant Examiner—Dinh T. Le
Attorney, Agent, or Firm—Gerald L. DePardo

[57] ABSTRACT

A reduced phase-shift nonlinear filter includes linear filter logic 10 responsive to a filter input signal x and having a linear transfer function G(s), which provides a linear filtered signal g, zero-cross sample-and-hold logic 16 responsive to the filter input signal x and the linear filtered signal g, which provides a square wave signal n which crosses zero at the same time and in the same direction as the filter input signal x and has an amplitude proportional to the value of the linear filtered signal g at that time, complementary filter logic 20 responsive to said square wave signal n and having a complementary transfer function (1–G(s)) which provides a complementary filtered signal c, and a summer 30 which adds the complementary filtered signal and the linear filtered signal to provide a filter output signal y which exhibits less phase shift over certain frequency bands than that of the linear transfer function. If the linear transfer function has numerator and denominator polynomials of the same order, the complementary transfer function (1–G(s)) 20 may be a reduced-order transfer function.

36 Claims, 16 Drawing Sheets

REDUCED PHASE-SHIFT NONLINEAR FILTERS

TECHNICAL FIELD

This invention relates to nonlinear filters and in particular reduced phase shift nonlinear filters.

BACKGROUND ART

Signal processing filters, such as lowpass, bandpass, highpass, or notch filters, are widely used in electronic control and communication systems. Such filters have gains (output over input relationship) which modify an input signal in a way which varies with frequency. They can be configured so that the magnitude of the output signal from the filter differs from the input signal in a predetermined way over a predetermined frequency range, depending on the type of filter. For example, a lowpass filter passes low frequencies and attenuates high frequencies and a bandpass filter passes a certain band of frequencies (the "passband") and attenuates frequencies outside this band.

One problem with linear filters, however, is that they also cause a phase shift between the input and output signals at certain frequencies. In particular, Bode's signal processing theory shows that the phase of the frequency components of the output signal of a linear filter will be shifted by at least a predetermined minimum amount which varies with frequency. Linear filters that shift phase only this amount are called minimum-phase filters. Also, the amount of phase shift at a particular frequency increases as the rate of gain variation around that frequency increases, and decreases as rate of gain variation around that frequency decreases.

Many applications which utilize filters are "phase sensitive", meaning that the phase shift associated with the gain variations of the filter compromises performance. For example, it is desirable for feedback controllers within a control system to have high gain at frequencies below the desired system bandwidth, to attenuate errors quickly enough, and to have low gain at higher frequencies to maintain stability margins. For high performance systems, it is desirable for the feedback control gain to drop from high to low values over a narrow frequency range. However, when the gain is reduced by a controller within a certain frequency, there is a significant consequential phase lag at lower frequencies. The narrower the frequency range, the greater the phase lag at lower frequencies. In many applications, this phase lag impairs feedback control performance by reducing the allowable gain of the feedback controller at such lower frequencies, thereby increasing the system time response, and narrowing the system bandwidth, as is known.

One technique known in the art to reduce the amount of phase shift of a simple, first order lag filter is to add nonlinear logic to the filter. In particular, the Clegg integrator and First Order Reset Element (FORE), first disclosed in the 1950's, use a nonlinearity to reduce the phase lag of a simple first order lag filter. Such a FORE non-linear filter resets the integrator element in an otherwise linear lag filter, so as to drive the filter output to zero each time the input crosses zero. However, such a FORE non-linear filter is not readily expandable to more complex filter arrangements.

Thus, it would be desirable to provide a filter which reduces the amount of phase shift between the input and the output signal.

DISCLOSURE OF INVENTION

Objects of the invention include provision of a filter which reduces the amount of phase shift between the output signal and the input signal.

According to the present invention a reduced phase-shift nonlinear filter, comprises a linear filter responsive to a filter input signal and having a linear transfer function, which provides a linear filtered signal; zero-cross logic responsive to the filter input signal and the linear filtered signal, which provides a square wave signal which crosses zero at the same time and in the same direction as the filter input signal and has an amplitude proportional to the magnitude of the linear filtered signal when the filter input signal crosses zero; a complementary filter responsive to the square wave signal and having a complementary transfer function which is complementary to the linear transfer function, which provides a complementary filtered signal; and the complementary filtered signal and the linear filtered signal being added together to provide a filter output signal which exhibits less phase shift between the filter input signal and the filter output signal over predetermined frequency bands than that of the linear transfer function.

According further to the present invention, the linear transfer function comprises a numerator polynomial and a denominator polynomial both having the same order and the complementary transfer function comprises a reduced-order transfer function which has a numerator polynomial of a lower order than the denominator polynomial. According still further to the present invention, the amplitude of the square wave signal is equal to the value of the linear filtered signal when the filter input signal crosses zero.

The present invention represents a significant improvement over the prior art by altering the construction of a (minimum phase) linear filter so as to introduce a nonlinear component, thereby providing an output signal which has less phase shift than the linear filter. Also, the invention allows for a generic construction of a reduced phase-shift filter for any linear filter counterpart or plurality of linear filters. Further, the invention may use only a single sample-and-hold and a single zero-crossing logic, thereby allowing large complex linear filters to be constructed with reduced cost and/or complexity. Still further, the invention allows for adjustment of the amount of phase shift reduction and associated non-linearity of the output signal.

The foregoing and other objects, features and advantages of the present invention will become more apparent in light of the following detailed description of exemplary embodiments thereof as illustrated in the accompanying drawings.

BEST MODE FOR CARRYING OUT THE INVENTION

Figure 1:
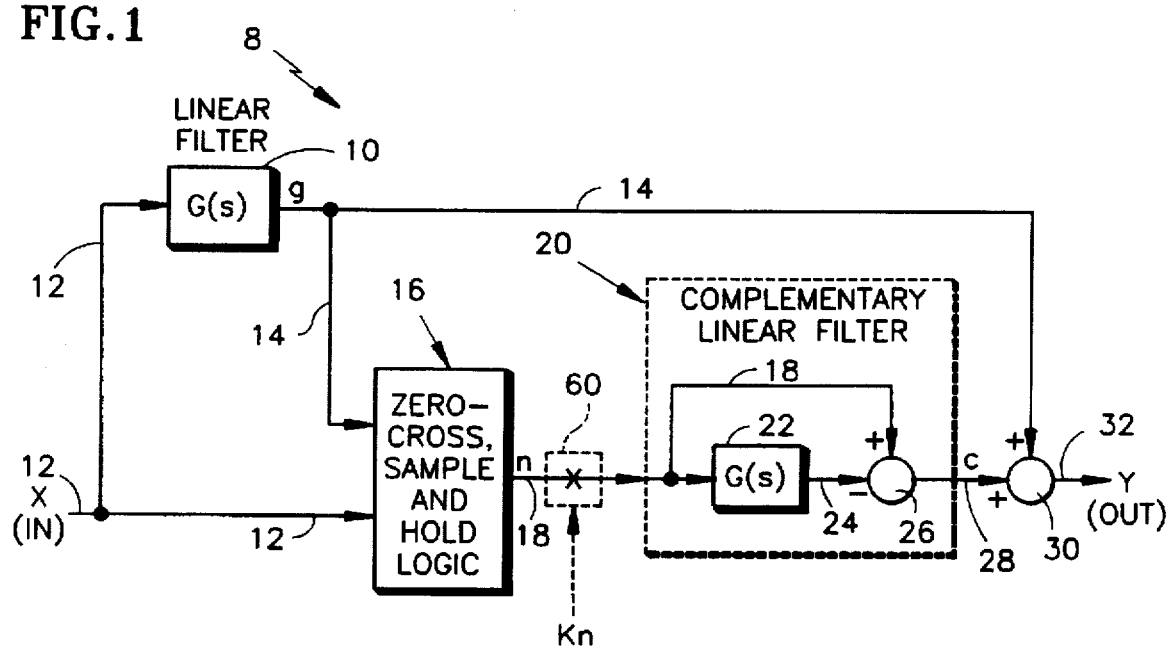
FIG. 1 is a schematic block diagram non-linear reduced phase-shift filter, in accordance with the present invention.

Referring to FIG. 1, a non-linear reduced phase-shift filter 8 includes linear filter logic 10 having a transfer function $G(s)$ which receives an input signal x on a line 12 where 's' is the Laplace transformation. The linear filter logic 10 produces an output signal g on a line 14 indicative of the response of the linear filter transfer function $G(s)$ to the input signal x. The signal g is fed to zero-cross, sample-and-hold logic 16. The zero-cross, sample-and-hold logic 16 also receives the input signal x on the line 12. The logic 16 samples the signal g when the input signal x crosses zero and provides a signal n on a line 18 which is a square wave signal which crosses zero at the same time as and in the same direction as the input signal x and has an amplitude equal to the signal g at the time of sampling, as discussed more hereinafter.

The signal n on the line 18 is fed to complementary linear filter logic 20, which is configured to have a complementary linear filter transfer function to $G(s)$, i.e., $1-G(s)$. In particular, if the linear filter 10 and the complementary filter 20 were driven by a common input signal and their outputs were added together, the resultant output would be equal to the input at all times and for all frequencies (i.e., $G(s)+(1-G(s))=1$).

Within the complementary filter logic 20 the line 18 is fed to another linear filter 22 having a transfer function $G(s)$, the same as the linear filter function 10 discussed hereinbefore. The output of the filter 22 is provided on a line 24 which is fed to the negative input of a summer 26. The line 18 is also fed to a positive input of the summer 26. The output of the summer 26 is provided on a line 28 which is the output signal c of the complementary linear filter logic 20.

The signal c on the line 28 is fed to a positive input of a summer 30. The signal g from the linear filter 10 on the line 14 is also provided to another positive input of the summer 30. The summer 30 provides an output signal y on a line 32 which is the output of the reduced phase shift filter 8.

Figure 2:
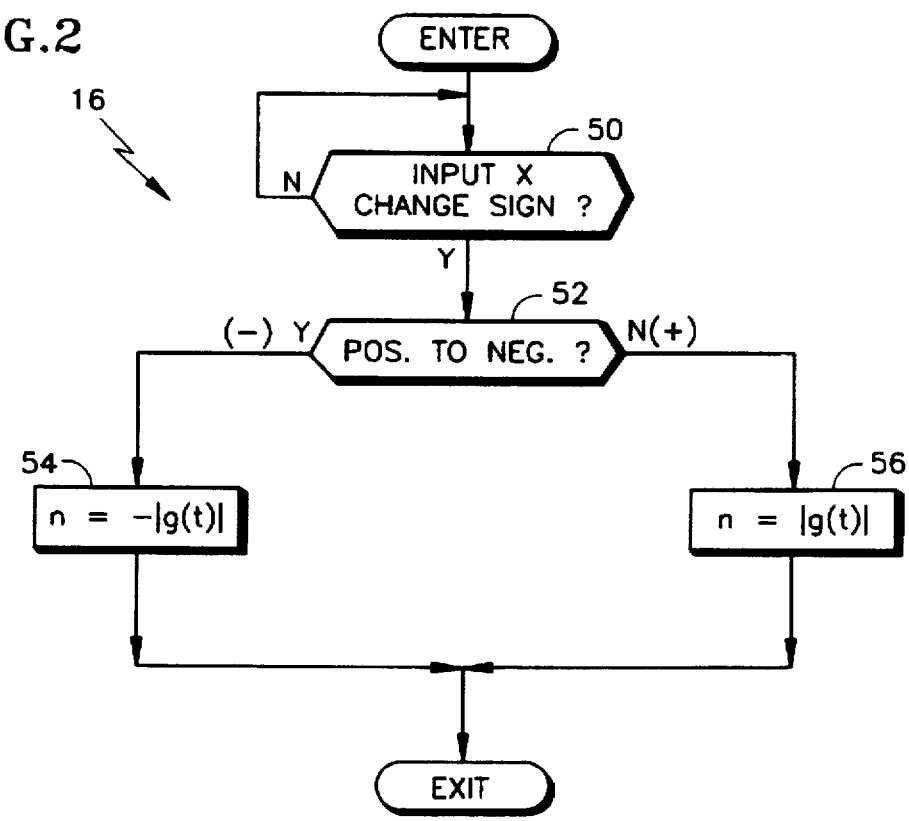
FIG. 2 is a flow diagram of zero-crossing, sample-and-hold logic, in accordance with the present invention.

Referring now to FIG. 2, the zero-cross, sample-and-hold logic 16 (FIG. 1) samples the input signal x on the line 12 at a predetermined rate, e.g., 100K Hz, and determines at a step 50 whether the input signal x has changed sign since the previous sample (i.e., whether it has crossed through zero). If not, the input is sampled again at the next sample time. If the input has changed sign, a step 52 determines if the change in sign was from positive to negative. If the change was from positive to negative, a step 54 sets the value of n to the negative of the absolute value of g at the time the sampling occurred and the logic 16 is exited. Conversely, if the change in sign of the input signal x is from negative to positive (i.e., not from positive to negative) a step 56 sets the value of n to the absolute value of g and the logic 16 is exited. In either case, the value of n is held constant until the next sampling event.

Accordingly, the sampling of the linear filter output signal g (and the updating of the signal n) occurs only at the instant that the filter input signal x crosses zero and the sign of n is set based on the direction that the input signal x crosses zero and equal to the value of g at that time. Thus, the signal n is a square wave function which crosses zero at the same time and in the same direction as the input signal x and has an amplitude equal to the value of the signal g at that time.

Other sample rates for the input signal x may be used if desired or sampling may be continuous as in an analog system. However, it should be understood that independent of the sample rate of x, the time at which the signal g is sampled is when the logic detects that the input signal x crosses zero. Also, other digital logic or software, and/or analog circuits may be used if desired to achieve the same result for the signal n.

Alternatively, in FIG. 1 the signal n may be multiplied by a gain Kn as indicated by an optional multiplier 60. In that case, the value of Kn is set so as to set the amplitude of the square wave signal n to be proportional to the signal g at the sample time. This allows the amount of phase shift reduction to be adjusted (decreased) and the amount of non-linearity (harmonic distortion; discussed hereinafter) of the output signal to be decreased. For example, if Kn=0.5, there would be less phase shift reduction but the output signal would exhibit decreased higher harmonic amplitudes (discussed hereinafter). For the illustrations shown herein, the gain Kn is set to one.

Figure 3:
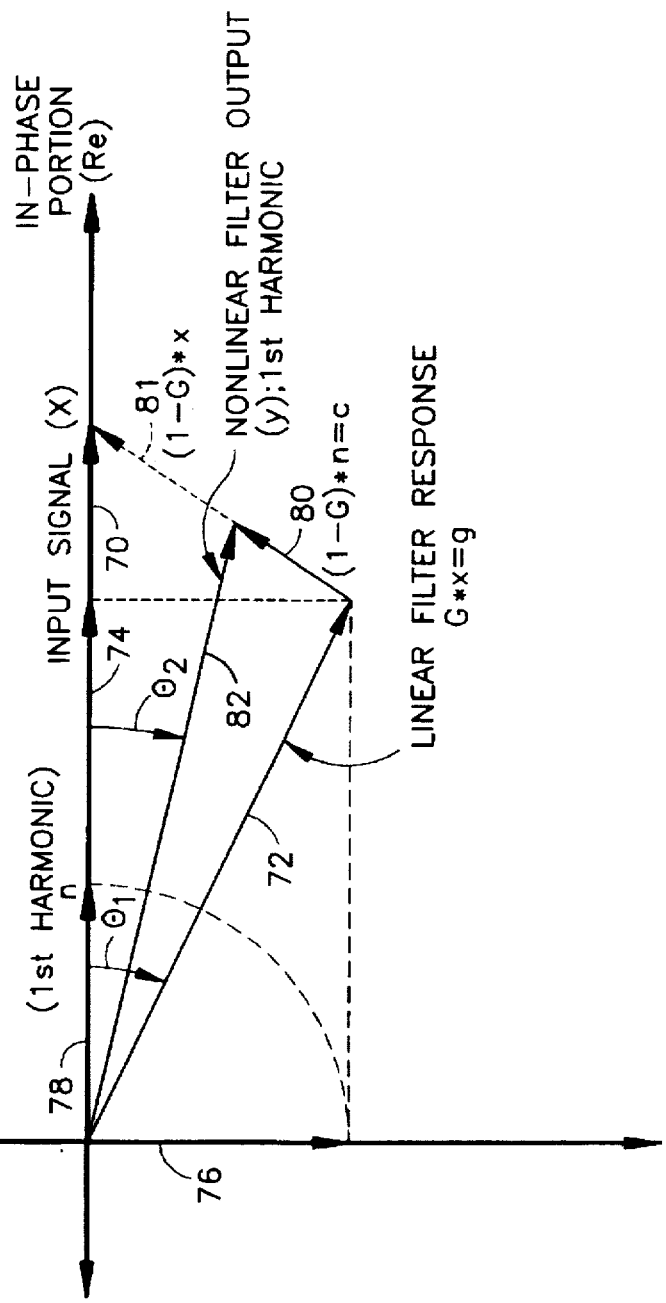
FIG. 3 is a vector diagram of the in-phase (real) and out-of-phase (imaginary) components of various signals of the non-linear reduced phase-shift filter of FIG. 1 when the input is a sinusoid of particular frequency, in accordance with the present invention.

Referring now to FIG. 3, the first harmonic response of the of nonlinear filter 8 is shown in terms of gain vectors in the complex plane for a particular sinusoidal input frequency. The gain vectors are complex in that they include vector components for in-phase and out-of-phase responses. The length of the gain vector is the gain amplitude and the angle between the gain and the in-phase axis is the phase shift between the input signal x and a given response vector. If the gain vector is a clockwise rotation from the real axis, the output has a phase lag.

In particular, the input signal x is indicated by a vector 70 along the in-phase axis having a length equal to the amplitude of the input signal x. The response g of the linear filter G(s) 10 (FIG. 1) to the input signal x is indicated by a complex vector 72 (G(s)*x), having an in-phase (or real) component vector 74, and an out-of-phase (or imaginary) component vector 76. The phase shift between the input signal x and the output signal g is indicated by an angle $\theta_1$ which, in this case, is a phase lag because it is below the in-phase (or real) axis.

Since the signal n is a square wave function which crosses zero at the same time and in the same direction (i.e., with the same polarity) as the input signal x, as discussed hereinbefore, the signal n is always in-phase with the input signal x. Accordingly, the signal n is shown as a vector 78 originating at the origin and extending along the in-phase axis, indicating that the signal n is in-phase with the input signal x (i.e., zero phase shift between the input signal x and the signal n).

Also, the amplitude of the signal n vector 78 is equal to the amplitude (peak value) of the out-of-phase component of the linear filter response g (i.e., the vector 76) at a given frequency. Since the magnitude of the out-of-phase component 76 varies with frequency, the amplitude of n also varies with frequency but, in contrast to a linear filter, n is always in-phase with the input signal x, and there is no change in the phase between x and n over frequency.

In particular, at the time of sampling the signal g (when the input x crosses zero), the in-phase component 74 of the linear filter response is zero and the out-of-phase component 76 is at its maximum or minimum value. More specifically, for an input signal x of sin(ωt), the output of a linear transfer function will be Asin(ωt+φ), where A is the gain of the filter transfer function, and φ is the phase shift between the input and output signals which varies with frequency. It is known that sin(ωt+φ)=sin(ωt)*cos(φ)+cos(ωt)*sin(φ). When the input signal sin(ωt) crosses through zero, the value of sin(ωt) is zero. Thus, the output response g at that time is equal to Acos(ωt)*sin(φ), where cos(ωt) is equal to ±1 at the time that sin(ωt) is zero, thereby making the linear filter response g at the zero crossing equal to ±Asin(φ) where φ is the phase shift between the input and output signals which varies with frequency and is in-effect the maximum or minimum out-of-phase (or imaginary) component 76 of the output signal g.

When the signal n is fed to the complementary filter (1−G(s)) 20 (FIG. 1), the complementary filter 20 produces the signal c which reduces the phase shift of the linear filter response g when c is added to the linear filter response g. In particular, when the signal n is fed into the complementary linear filter 20 having a transfer function 1−G(s), the first harmonic response of the complementary filter is indicated by a vector 80 [(1−G(s))*n]. The length of the vector 80 is proportional to the ratio of the amplitudes of the signal n to the signal x (i.e., n/x). In the limit, if the input signal x to the linear filter G(s) was also the input signal to the complementary filter 1−G(s), the output signal y would equal the input signal x because: G(s)+[1−G(s)]=1, for the overall transfer function of the filter, as indicated by the extension of length of the vector 80 along a dashed line 81 (as discussed hereinbefore).

When the response vector 80 of the complementary filter function 1−G(s) is added to the response vector 72 of the linear filter function G(s), the first harmonic of the resultant output response signal y is shown as a vector 82, i.e., the sum of the two response vectors 72,80 (i.e., G(s)*x [1−G(s)]*n= y).

The phase shift associated with the first harmonic of the output signal y of the non-linear filter 8 (FIG. 1) shown by the response vector 82 is indicated by an angle $\theta_2$, which is a smaller angle than the angle $\theta_1$ exhibited by the signal g of the linear filter G(s) shown by the response vector 72. Also, the length of the vector 82 is slightly longer than that of the vector 72. Thus, the nonlinear filter 8 of the present invention provides significantly less phase shift and only a slight change in gain (magnitude) as compared to the linear filter counter-part.

It should be understood that the complex vector diagram FIG. 3 illustrates the invention for a filter exhibiting a phase lag (negative phase angle). For a filter exhibiting a phase lead (positive phase angle), the vectors 72,82 and the angles θ1,θ2 would be the mirror image of those shown in FIG. 3, but above the in-phase (or real) axis (i.e., in the first quadrant or positive phase region of the complex coordinate system of FIG. 3).

The linear filter function G(s) used in the blocks 10, 22 (FIG. 1) may be any transfer function desired, e.g., lowpass, bandpass, highpass, or notch filters, or any combination thereof (some examples are discussed hereinafter). Also, the functions G(s), 1−G(s), and/or the entire non-linear filter 8 or any portion thereof may be implemented in digital and/or analog hardware logic or by a digital computer in software and/or an analog computer.

First Order Low Pass

Referring now to FIGS. 4-7, the response of the non-linear filter 8 (FIG. 1) of the present invention is shown for G(s) being a first order lowpass filter with the following transfer function:

$$G(s)=\omega_n/(s+\omega_n) \quad \text{[Eq. 1]}$$

where $\omega_n$=20 πradians/sec=2 π$f_n$; or $f_n$=10 Hz.

Figure 4:
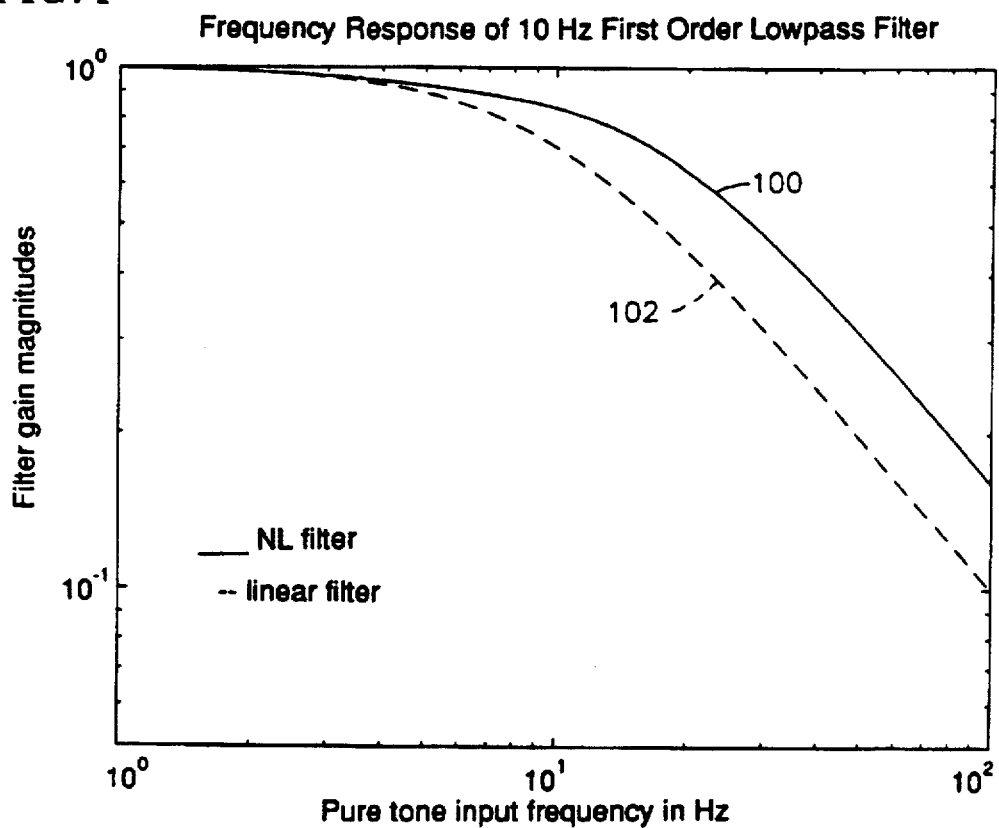
FIG. 4 is a graph of the magnitude frequency response for linear and non-linear 10 Hz first order lowpass filters, in accordance with the present invention.

In particular, referring now to FIG. 4, the magnitude frequency response of the prior art minimum-phase linear filter G(s) is shown by a dashed curve 102 and the magnitude frequency response of the first harmonic of the non-linear reduced-phase shift filter (analogy of the linear filter) of FIG. 1 of the present invention is shown by a solid curve 100, which shows a very similar magnitude response profile to that of the linear filter response curve 102.

Figure 5:
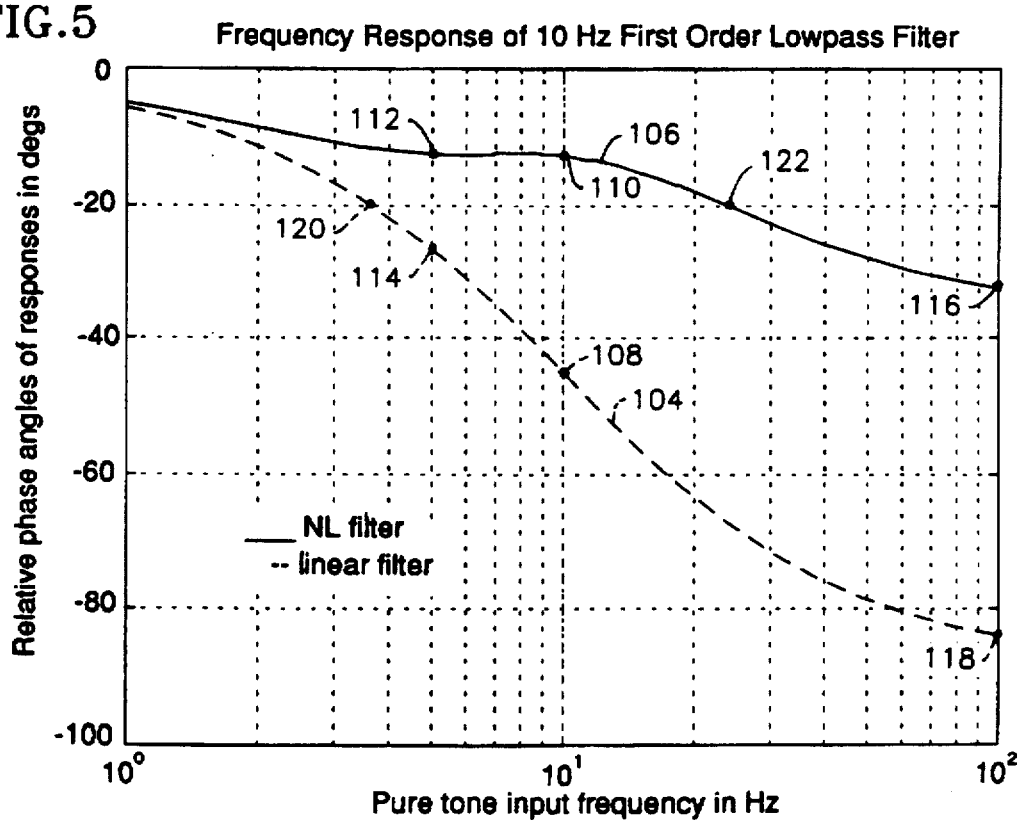
FIG. 5 is a graph of the phase frequency response for linear and non-linear 10 Hz first order lowpass filters, in accordance with the present invention.

Referring to FIG. 5, the phase frequency response for the prior art linear filter G(s) is shown by a dashed curve 104 and the phase frequency response of the first harmonic of the non-linear reduced phase shift filter of FIG. 1 of the present invention is shown by a curve 106. As can be seen by comparison of the curves 104,106, the present invention reduces the phase lag from that exhibited by the linear prior art filter.

In particular, at the break frequency $f_n=10$ Hz, the phase lag is reduced from a value of 45° at a point 108 of the prior art linear filter to a value of 11.58° at a point 110 on the nonlinear response curve 106 of the present invention. Also, at a frequency of 5 Hz the phase lag of the nonlinear filter is 11.64°, as indicated by a point 112 on the curve 106, whereas the phase lag of the linear filter is 26.57°, as indicated by a point 114 on the curve 104. Similarly, at a decade above the break frequency, i.e., at 100 Hz, the nonlinear filter exhibits a phase lag of 32.93°, as indicated by a point 116 on the curve 106, whereas the linear filter response at the same frequency exhibits a phase lag of 84.25°, as indicated by a point 118 on the curve 104. In general, the frequency where absolute value of phase shift is greater than 20° is important for feedback control applications. In this case, the linear filter crosses through 20° phase lag at a point 120, at a frequency of about 3.8 Hz, whereas the non linear filter exhibits 20° phase lag at a point 122, at a frequency of about 25 Hz, a 6:1 improvement over the linear filter.

Figure 6:
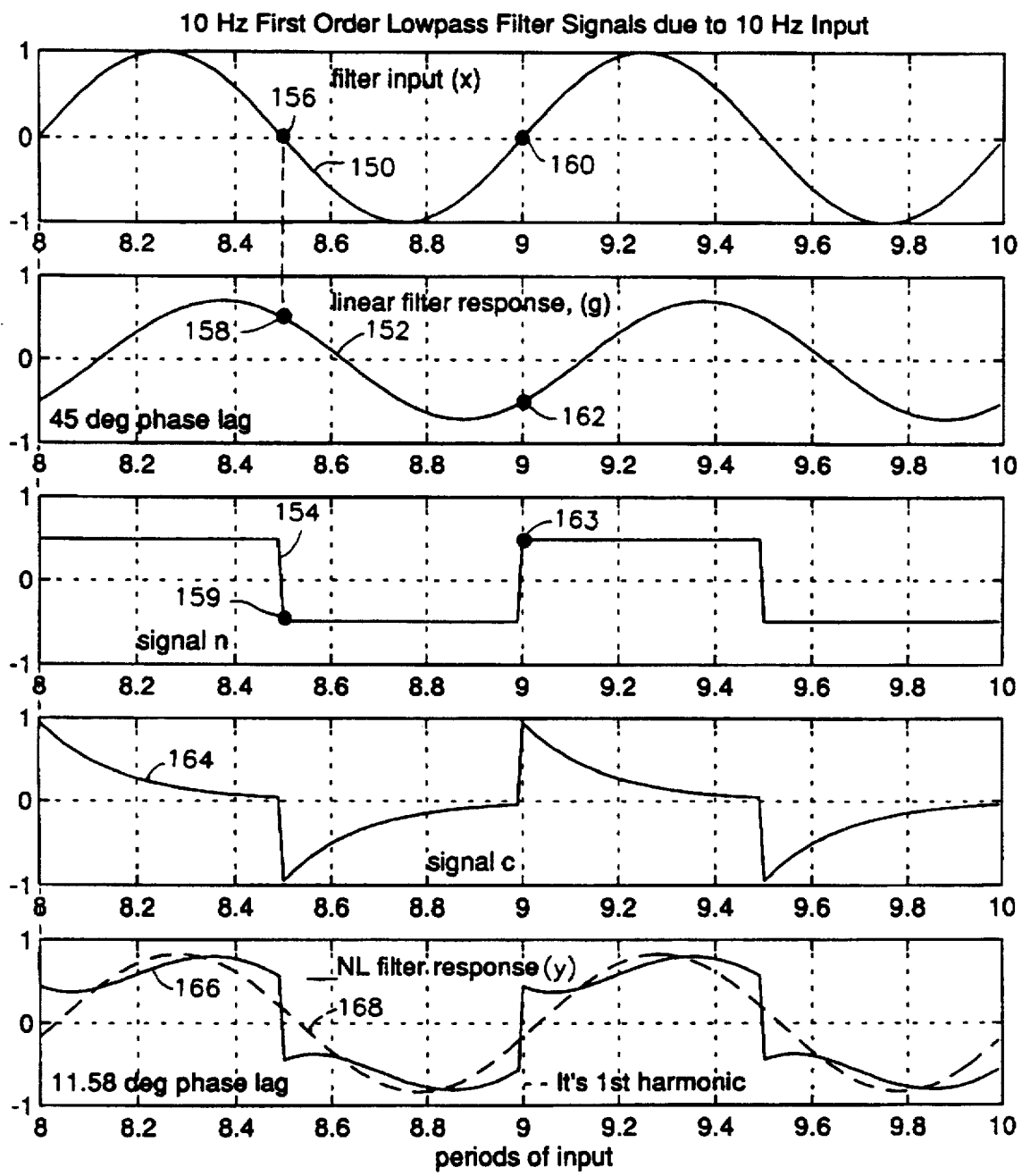
FIG. 6 shows five time graphs of various signals of a non-linear 10 Hz first order lowpass filter, when the input sinusoid frequency is 10 Hz, in accordance with the present invention.

Referring now to FIG. 6, a series of time graphs are shown for a given input signal x showing the time response of the signals g,n,c,y in FIG. 1. In particular, when G(s) is the filter of Eq. 1 and the input signal x is a 10 Hz input signal as indicated by a curve 150, the time response g of the linear filter 10 (FIG. 1) G(s) is indicated by a curve 152. Also, the signal n provided by the zero-cross, sample and hold logic 16 (FIG. 1) is indicated by a square wave curve 154. The signal (n) 154 changes at each zero crossing of the input signal x based on the logic 16.

More specifically, referring to FIGS. 1, 2, and 6, when the input signal (x) 150 crosses through zero at a point 156, the transition is from positive-to-negative, and the value of n is set to the negative of the absolute value of g at a point 158 on the curve 152, as indicated by a point 159 on the curve 154 (n). Similarly, when the input signal x crosses through zero at a point 160 on the curve 150, the transition is from negative-to-positive, and the value of n is set to the absolute value of g at a point 162 on the curve 152, as indicated by a point 163 on the curve 154 (n). Thus, the signal n exhibits a square wave type function which crosses zero at the same time and in the same direction as the filter input x and having an amplitude equal to the value of g that time, as indicated by the curve 154.

The input n is fed to the complementary linear filter function 20 (FIG. 1) which for G(s) equal to the lowpass filter of Eq. 1, the transfer function for the complementary linear filter 20 is a high pass filter $(1-G(s))$. The response of the complementary linear filter 20 is indicated by a curve 164.

The resultant output signal y of the nonlinear filter 8 (FIG. 1) is indicated by a curve 166 (FIG. 6) which is the sum of the signals g and c. The first harmonic of the nonlinear filter response curve 166 is indicated by a curve 168. Also, the resultant change in phase shift is from a linear filter response g of 45° phase lag to a nonlinear filter response y of 11.58° phase lag, thereby reducing the phase shift of the overall filter response by about 34° (45–11).

Figure 7:
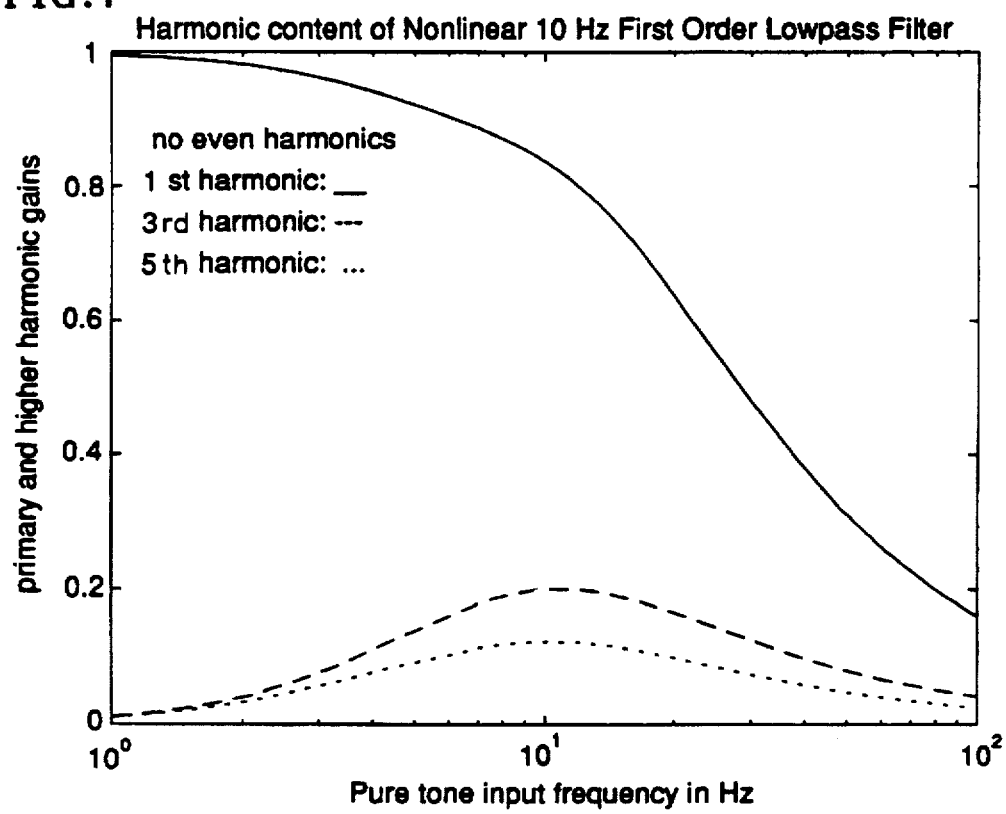
FIG. 7 is a graph of the harmonic content of a non-linear 10 Hz first order lowpass filter, in accordance with the present invention.

Referring now to FIG. 7, the nonlinear nature of the filter response curve 166 of FIG. 6 contains higher harmonics in addition to the first harmonic curve 168 shown in FIG. 6. The amplitudes of the first, third, and fifth harmonics of the output signal y for a pure sinusoidal input are shown in FIG. 7. No even harmonics exist in the output signal 166. The first harmonic is the same as that shown in the magnitude plot of FIG. 4, curve 102, but on a linear vertical scale.

Second Order Low Pass

Referring now to FIGS. 8–11, the response of the nonlinear filter 8 (FIG. 1) of the present invention is shown for G(s) being a second order lowpass filter with the following transfer function:

$$G(s)=\omega_n^2/(s^2+2\xi\omega_n s+\omega_n^2) \qquad [\text{Eq. 2}]$$

where $\xi=0.5$ and $\omega_n=20\pi$ rad/sec=$2\pi f_n$; or $f_n=10$ Hz.

Figure 8:
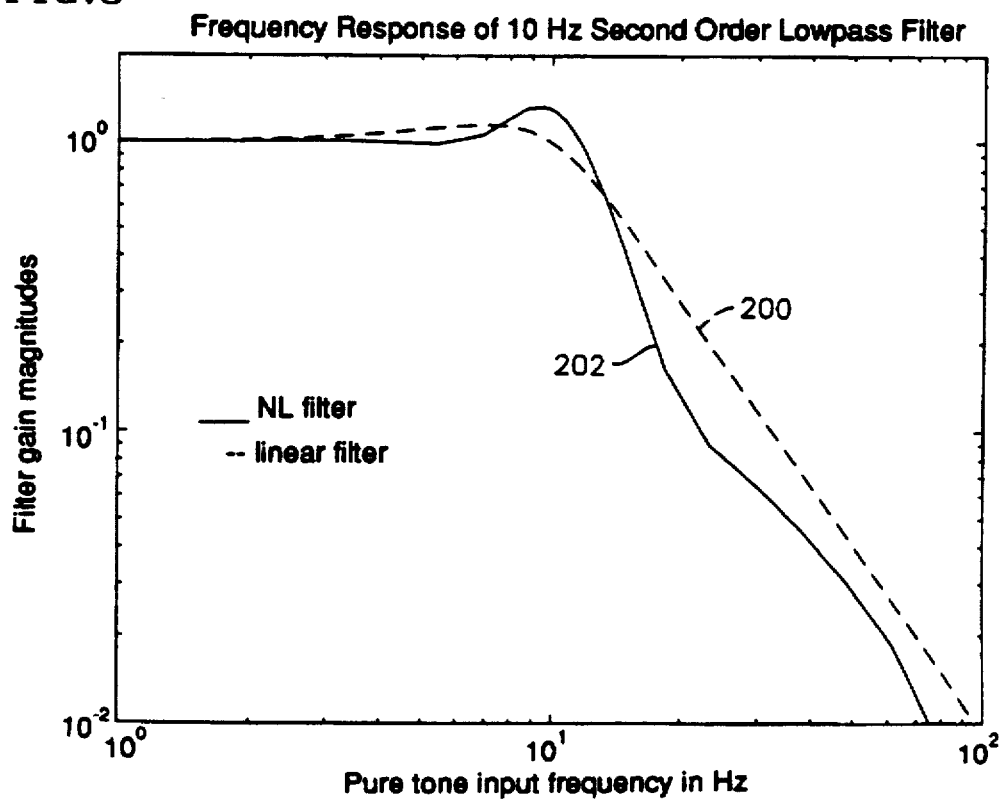
FIG. 8 is a graph of the magnitude frequency response for linear and non-linear 10 Hz second order lowpass filters, in accordance with the present invention.

In particular, referring now to FIG. 8, the magnitude frequency response of the prior art linear filter G(s) is shown by a dashed curve 200 and the magnitude frequency response of the first harmonic of the non-linear reduced phase-shift filter 8 (analogy of the linear filter) of FIG. 1 of the present invention is shown by a curve 202, which shows a very similar magnitude response profile to that of the linear filter response curve 200.

Figure 9:
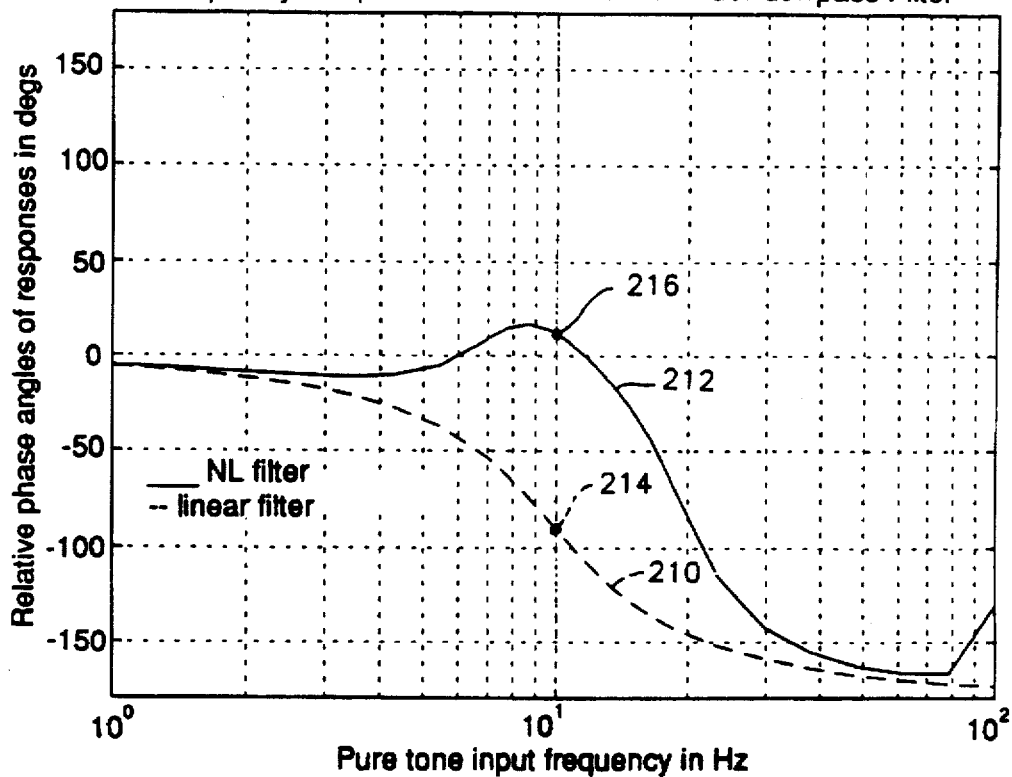
FIG. 9 is a graph of the phase frequency response for linear and non-linear 10 Hz second order lowpass filters, in accordance with the present invention.

Referring to FIG. 9, the phase frequency response for the prior art linear filter G(s) is shown by a dashed curve 210 and the phase frequency response of the first harmonic of the nonlinear reduced phase shift filter of FIG. 1 of the present invention is shown by a curve 212. As can be seen by comparison of the curves 210,212, the present invention reduces the phase lag from that exhibited by the linear prior art filter.

In particular, at the break frequency $f_n=10$ Hz, the prior art linear filter has a phase lag of 90° as indicated by a point 214 on the curve 210. Whereas the second order lowpass filter of the present invention exhibits a phase lead of 13.47° at the break frequency as indicated by a point 216 on the curve 212. At high frequencies, the phase lag of the non-linear second order lowpass filter of the present invention approaches that of the linear filter, i.e., 180°, however, it approaches it much later in frequency than that of the linear filter.

It should be understood that other break frequencies for the second order lowpass filter of Eq. 2 may be used if desired. For example, a filter with two real poles (i.e., the roots or eigenvalues of the denominator quadratic equation) are real numbers or if the poles are complex numbers (as in FIG. 8), other values for $\xi$ may be used if desired. Also, other filter orders can be used.

Figure 10:
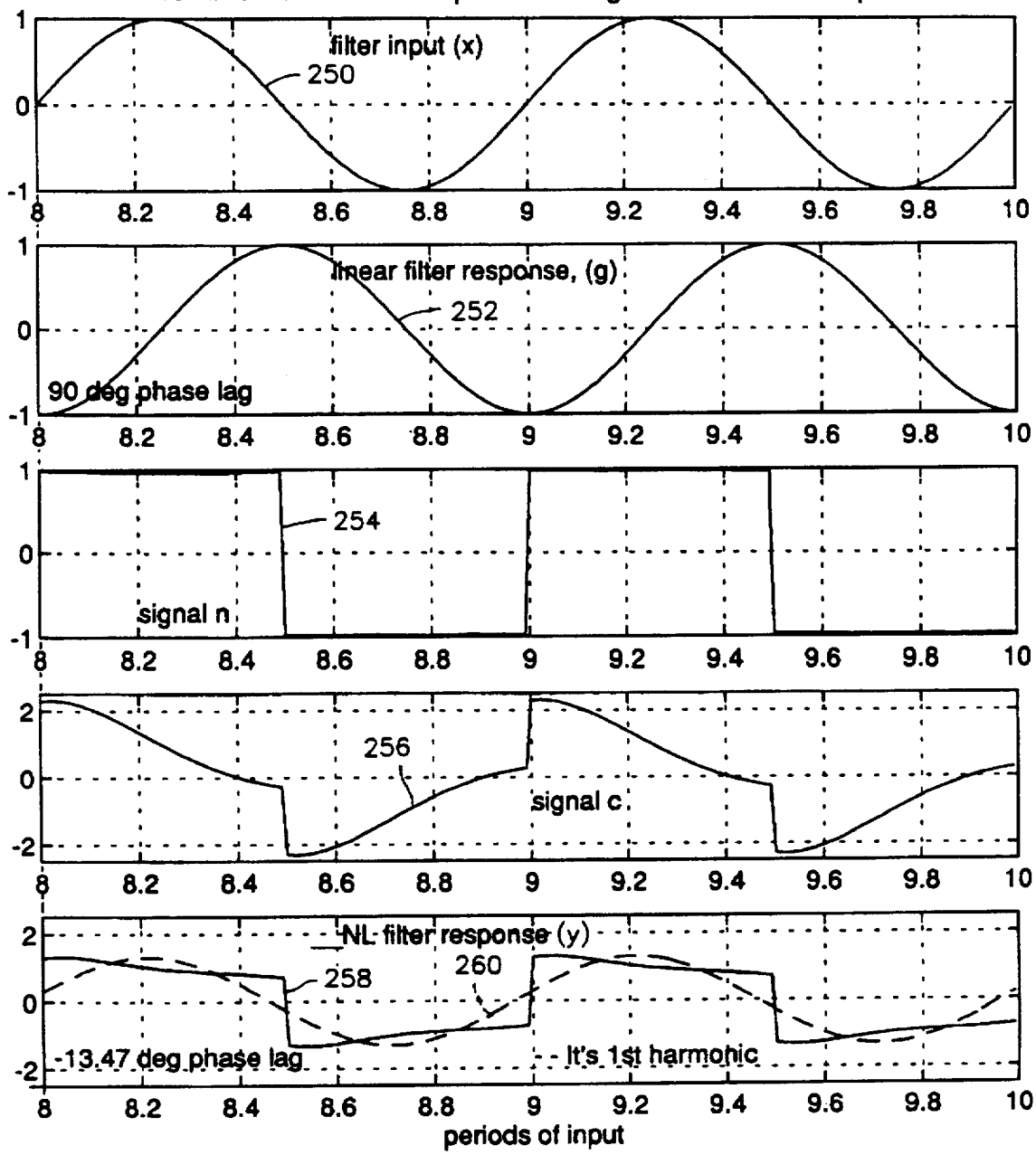
FIG. 10 shows five time graphs of various signals of a non-linear 10 Hz second order lowpass filter, in response to a 10 Hz sinusoidal input in accordance with the present invention.

Referring now to FIG. 10, a series of time graphs are shown for a given input signal x showing the time response of the signals g,n,c,y in FIG. 1. In particular, when G(s) is the filter of Eq. 2 and the input signal x is a 10 Hz input signal as indicated by a curve 250, the time response signal g of the linear filter 10 (FIG. 1) G(s) is indicated by a curve 252. The curve 252 of the response g shows a phase lag of 90° from the curve 250 of the input signal x.

The signal n provided by the zero-cross, sample and hold logic 16 (FIG. 1) is indicated by a square wave curve 254. The calculation of the signal n by the logic 16 is done in the same way as described hereinbefore for FIG. 6. As discussed hereinbefore, the signal n exhibits a square wave type function which crosses zero at the same time and in the same direction as the filter input x and has an amplitude equal to the value of g at that time, as indicated by the curve 254.

The input n is fed to the complementary linear filter function 20 (FIG. 1 which, for G(s) being the second order lowpass filter of Eq. 2, the transfer function for the complementary linear filter 20 is a second order high pass filter $(1-G(s))$. The response c of the complementary linear filter 20 is indicated by a curve 256.

The resultant output signal y of the nonlinear filter 8 is indicated by a curve 258 which is the sum of the signals g and c. The first harmonic of the nonlinear filter response curve 258 is indicated by a curve 260. Also, the resultant change in phase shift is from a linear filter response g of 90° phase lag to a nonlinear filter response y of 13.47° phase lead (or −13.47° lag), thereby reducing the magnitude of the phase shift of the overall filter response by about 77° (90°−13°).

Figure 11:
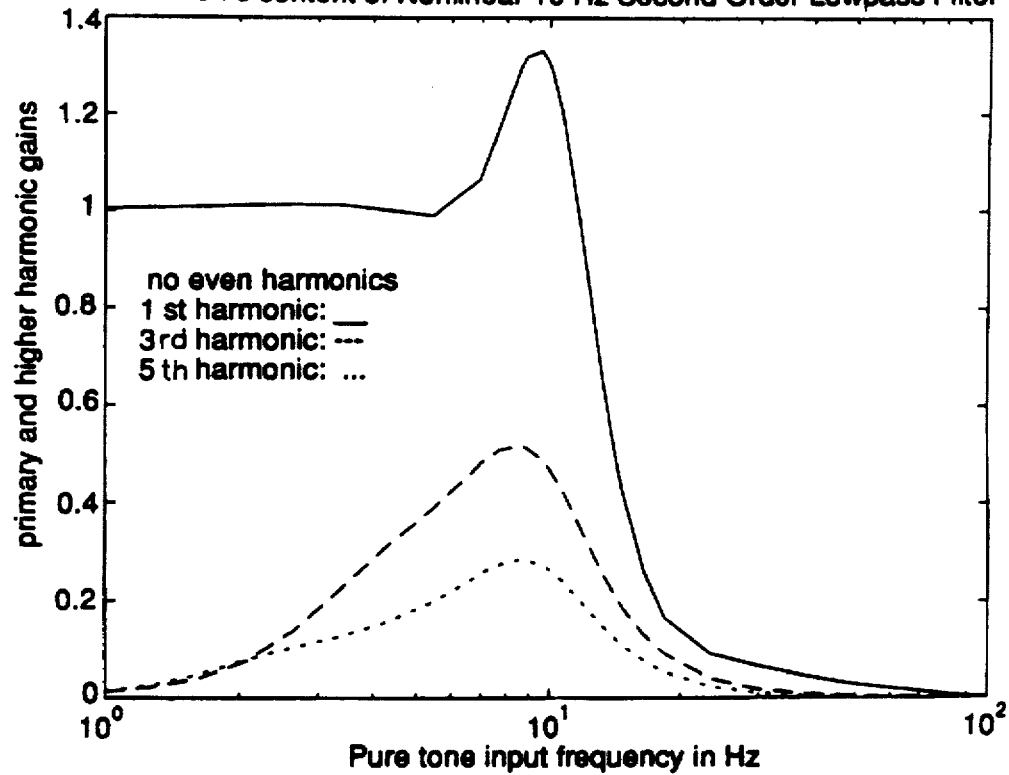
FIG. 11 is a graph of the harmonic content of a non-linear 10 Hz second order lowpass filter, in accordance with the present invention.

Referring now to FIG. 11, the nonlinear nature of the filter response curve 258 of FIG. 10 contains higher harmonics in addition to the first harmonic curve 260 shown in FIG. 10. The amplitudes of the first, third, and fifth harmonics of the output signal y for a pure sinusoidal input are shown in FIG. 11. No even harmonics exist in the output signal 258. The first harmonic is the same as that shown in the magnitude plot of FIG. 8, curve 202, but on a linear vertical scale.

Notch Filter

Referring now to FIGS. 12–15, the response of the non-linear filter 8 (FIG. 1) of the present invention is shown for G(s) being a second order notch filter (quadratic over quadratic) with the following transfer function:

$$G(s)=(s^2+2\xi_1\omega_n s+\omega_n^2)/(s^2+2\xi_2\omega_n s+\omega_n^2)$$ [Eq. 3]

where $\xi_1=0$, $\xi_2=0.5$, and $\omega_n=20\pi$ rad/sec=$2\pi f_n$; or $f_n=10$ Hz.

Figure 12:
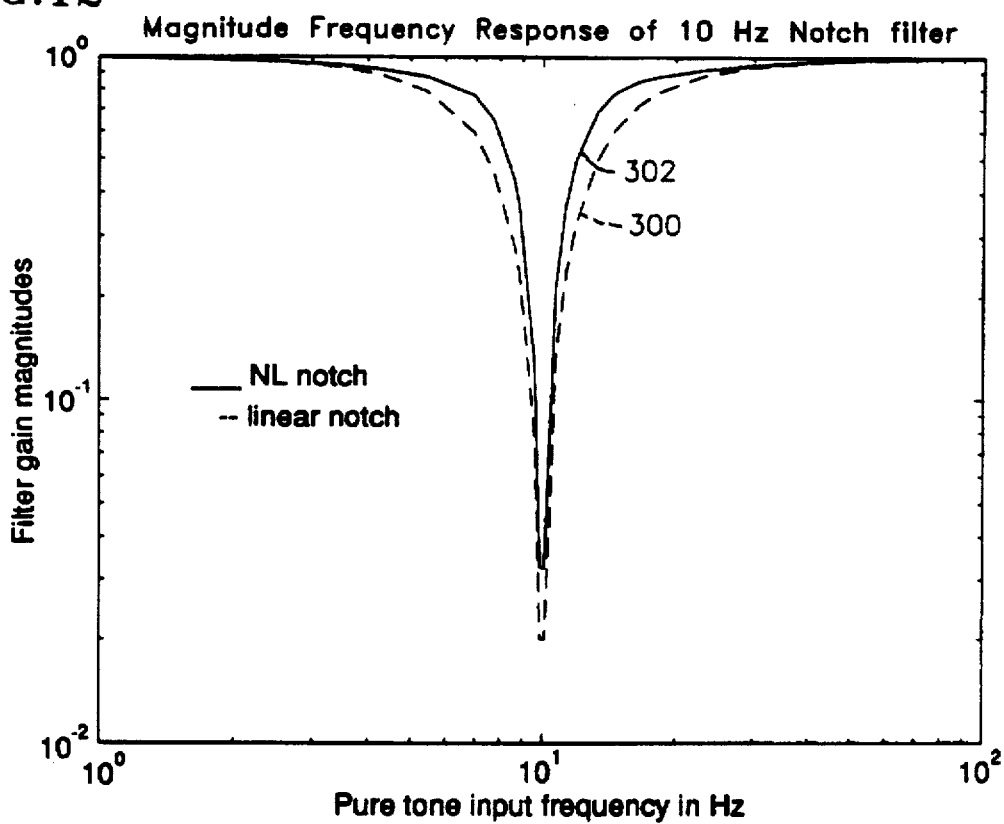
FIG. 12 is a graph of the magnitude frequency response for linear and non-linear 10 Hz second order notch filters, in accordance with the present invention.

In particular, referring now to FIG. 12, the magnitude frequency response of the prior art linear filter G(s) is shown by a dashed curve 300 and the magnitude frequency response of the first harmonic of the non-linear reduced phase-shift filter 8 (analogy of the linear filter) of FIG. 1 of the present invention is shown by a curve 302, which shows a very similar magnitude response profile to that of the linear filter response curve 300.

Figure 13:
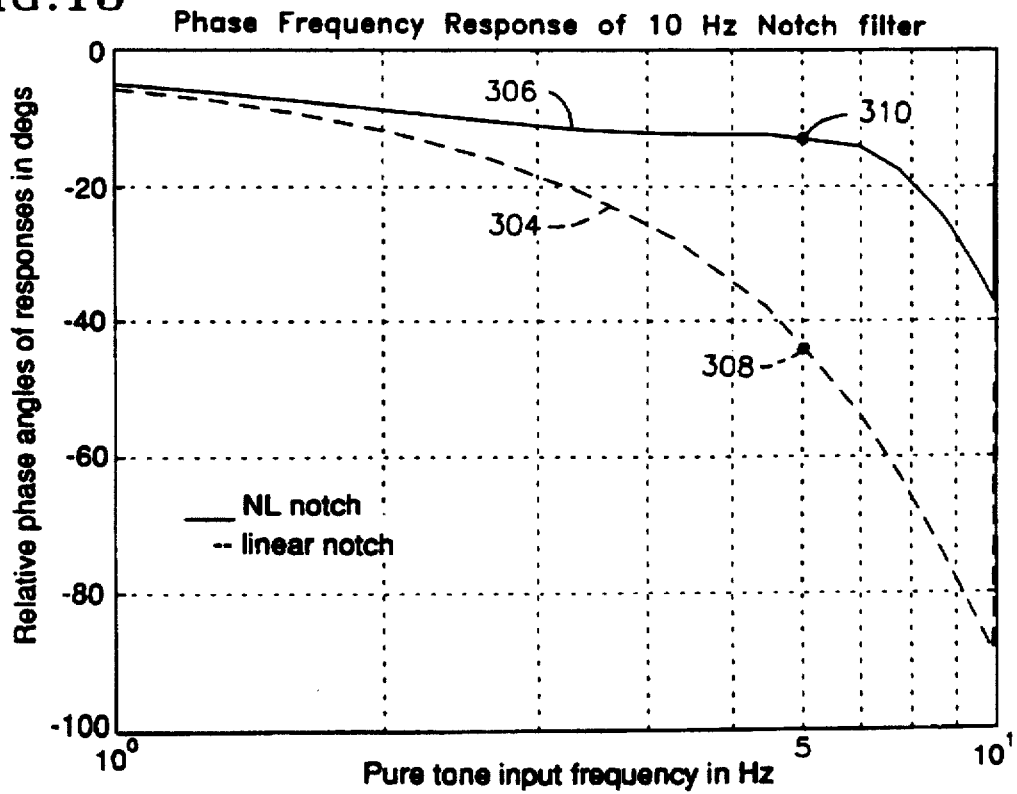
FIG. 13 is a graph of the phase frequency response for linear and non-linear 10 Hz second order notch filters, in accordance with the present invention.

Referring to FIG. 13, the phase frequency response for the prior art linear filter G(s) is shown by a dashed curve 304 and the phase frequency response of the first harmonic of the nonlinear reduced phase-shift filter of the present invention is shown by a curve 306. As can be seen by comparison of the curves 304,306, the present invention reduces the phase shift from that exhibited by the linear prior art filter, especially over a frequency range typically of interest for a notch filter, i.e., the decade before the notch frequency $\omega_n$.

In particular, at a frequency of 5 Hz the phase lag of the linear filter is 33.69° as indicated by a point 308 on the curve 304, whereas the phase lag for the nonlinear filter is 12.5° as indicated by a point 310 on the curve 306.

Figure 14:
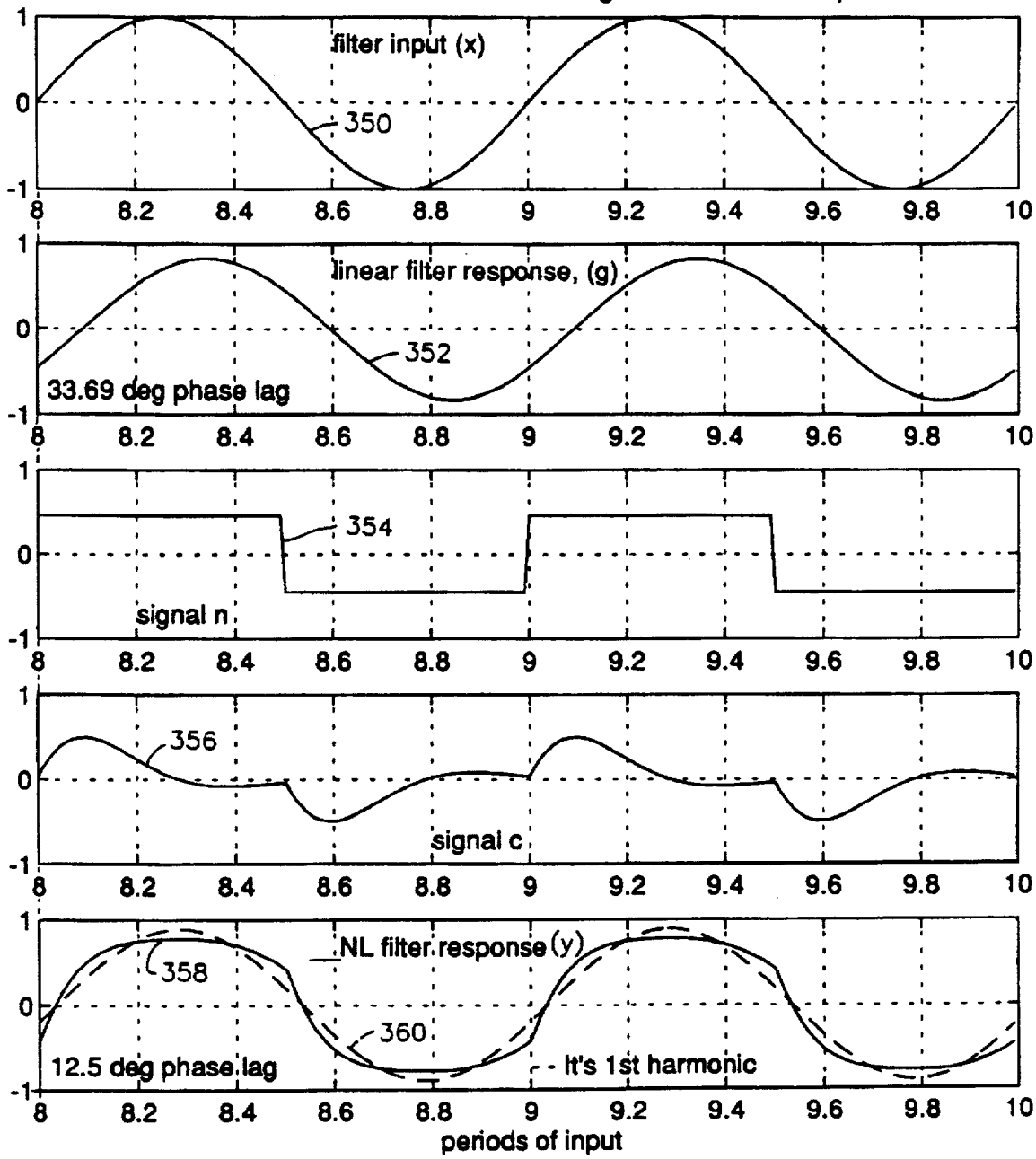
FIG. 14 shows five time graphs of various signals of a non-linear 10 Hz second order notch filter, in response to a 5 Hz sinusoidal input, in accordance with the present invention.

Referring now to FIG. 14, a series of time graphs are shown for a given input signal x showing the time response of the signals g,n,c,y in FIG. 1. In particular, when G(s) is the filter of Eq. 3 and the input signal x is a 5 Hz input signal as indicated by a curve 350, the time response signal g of the linear filter 10 (FIG. 1) G(s) is indicated by a curve 352 (FIG. 14). The curve 352 of the response g shows a phase lag of 33.69° and a slightly attenuated amplitude as compared to the curve 350 of the input signal x.

The signal n provided by the zero-cross, sample and hold logic 16 (FIG. 1) is indicated by a square wave curve 354 (FIG. 14). The calculation of the signal n by the logic 16 is done in the same way as described hereinbefore for FIG. 6. As discussed hereinbefore, the signal n exhibits a square wave type function which crosses zero at the same time and in the same direction as the filter input x and has an amplitude equal to the value of g at that time, as indicated by the curve 354.

The input n is fed to the complementary linear filter function 20 (FIG. 1) which, for G(s) being the second order notch filter of Eq. 3, the transfer function for the complementary linear filter 20 is a second order narrow band pass filter (1−G(s)). The response c of the complementary linear filter 20 is indicated by a curve 356.

The resultant output signal y of the nonlinear filter 8 is indicated by a curve 358 which is the sum of the signals g and c. The first harmonic of the nonlinear filter response curve 358 is indicated by a curve 360. Also, the resultant change in phase shift is from a linear filter response g of 33.69° phase lag to a nonlinear filter response y of 12.5° phase lag, thereby reducing the phase shift of the overall filter response by about 21° (34°−13°).

Figure 15:
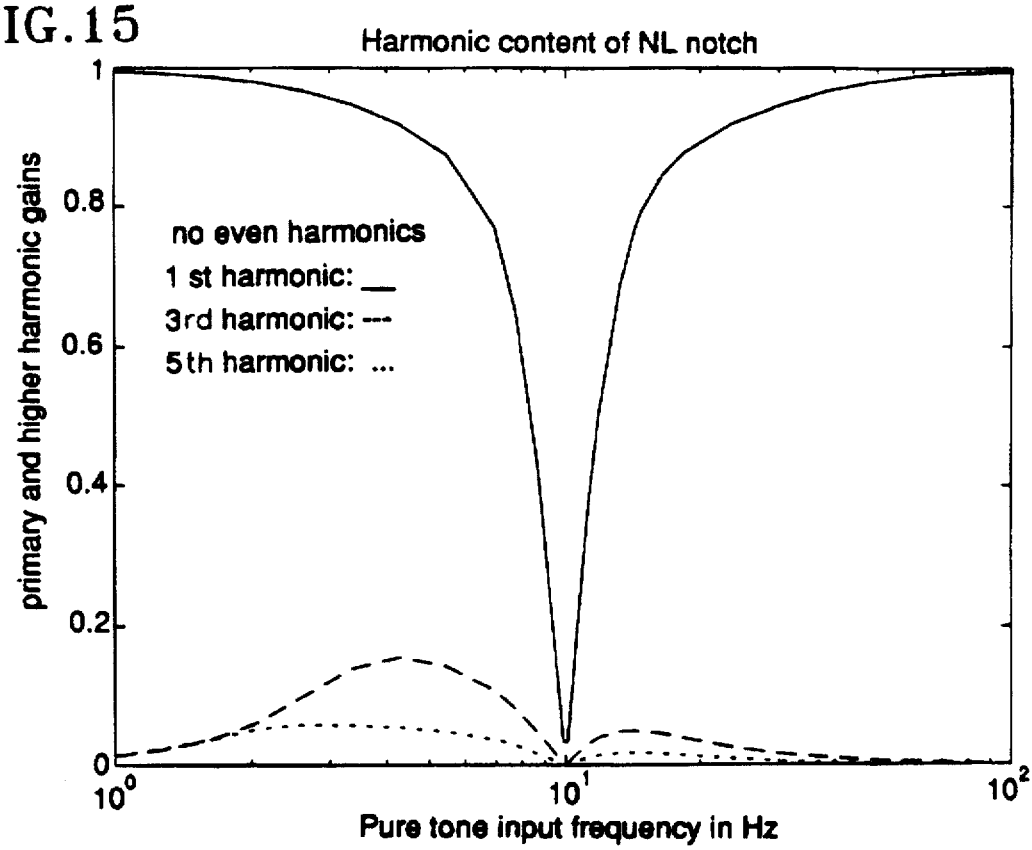
FIG. 15 is a graph of the harmonic content of a non-linear 10 Hz second order notch filters, in accordance with the present invention.

Referring now to FIG. 15, the nonlinear nature of the filter response curve 358 of FIG. 14 contains higher harmonics in addition to the first harmonic curve 360 shown in FIG. 14. The amplitudes of the first, third, and fifth harmonics of the output signal y for a pure sinusoidal input are shown in FIG. 15. No even harmonics exist in the output signal 358. The first harmonic is the same as that shown in the magnitude plot of FIG. 12, curve 302, but on a linear vertical scale.

First Order Highpass Filter

Referring now to FIGS. 16–19, the response of the non-linear filter 8 (FIG. 1) of the present invention is shown for G(s) being a first order high pass (or derivative lag) filter with the following transfer function:

$$G(s)=s/s+\omega_n$$ [Eq. 4]

where $\omega_n=20\pi$ rad/sec=$2\pi f_n$; or $f_n=10$ Hz.

Figure 16:
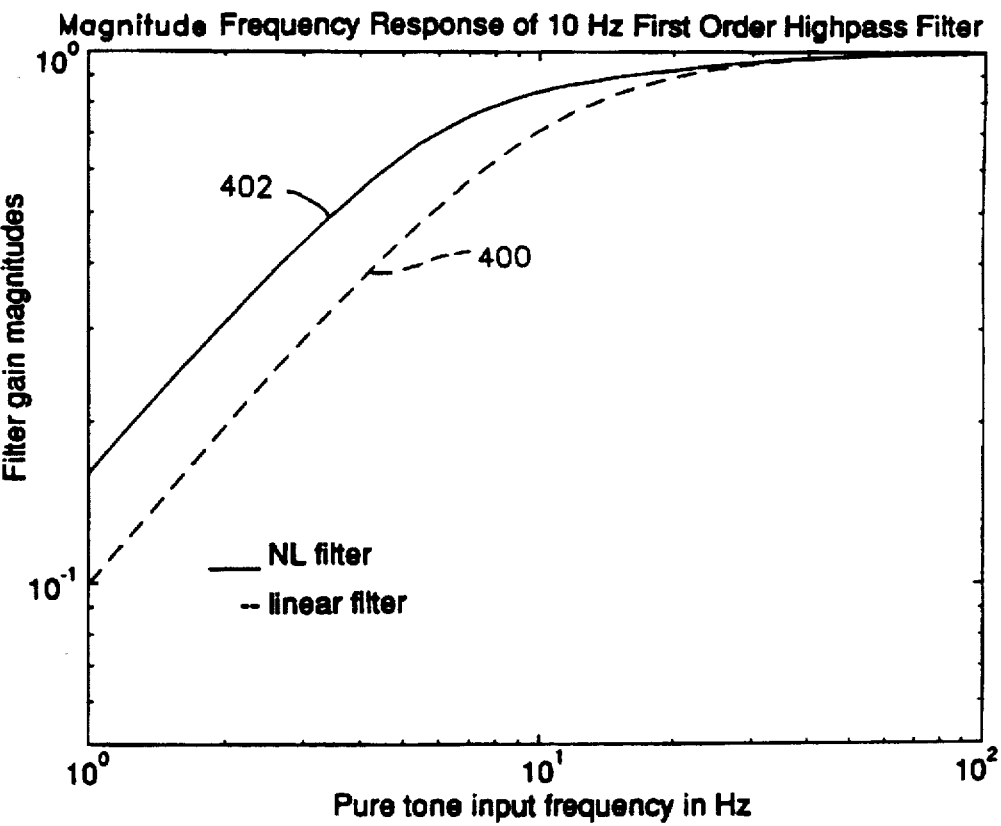
FIG. 16 is a graph of the magnitude frequency response for linear and non-linear 10 Hz first order high pass filters, in accordance with the present invention.

In particular, referring now to FIG. 16, the magnitude frequency response of the prior art linear filter G(s) is shown by a dashed curve 400 and the magnitude frequency response of the first harmonic of the non-linear reduced phase-shift filter 8 (analogy of the linear filter) of FIG. 1 of the present invention is shown by a curve 402, which shows a very similar magnitude response profile to that of the linear filter response curve 400.

Figure 17:
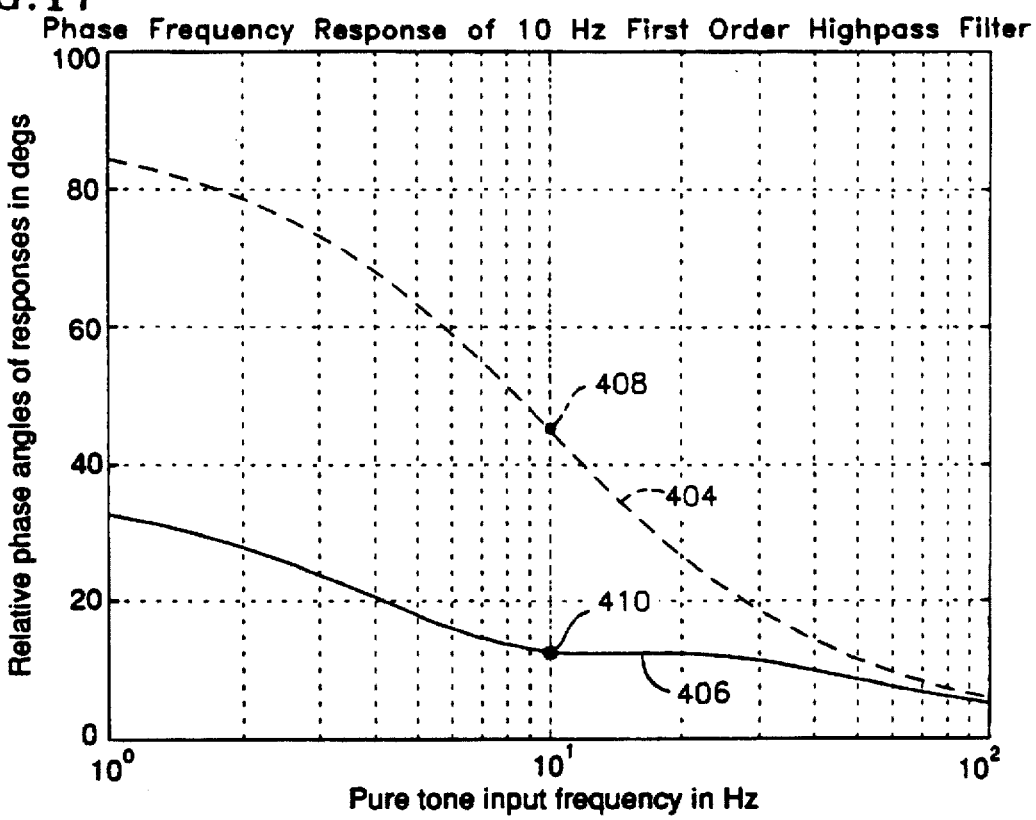
FIG. 17 is a graph of the phase frequency response for linear and non-linear 10 Hz first order high pass filters, in accordance with the present invention.

Referring to FIG. 17, the phase frequency response for the prior art linear filter G(s) is shown by a dashed curve 404 and the phase frequency response of the first harmonic of the nonlinear reduced phase-shift filter of FIG. 1 of the present invention is shown by a curve 406. As can be seen by comparison of the curves 404,406, the present invention reduces the phase shift from that exhibited by the linear prior art filter, i.e., reduction in phase lead below the break frequency at the break frequency and up to a decade after the break frequency.

In particular, at the break frequency the linear filter exhibits a phase lead of 45° as indicated by a point 408 on the curve 404, and a nonlinear filter response exhibits a phase lead of 12.33° as indicated by a point 410 on the curve 406.

Figure 18:
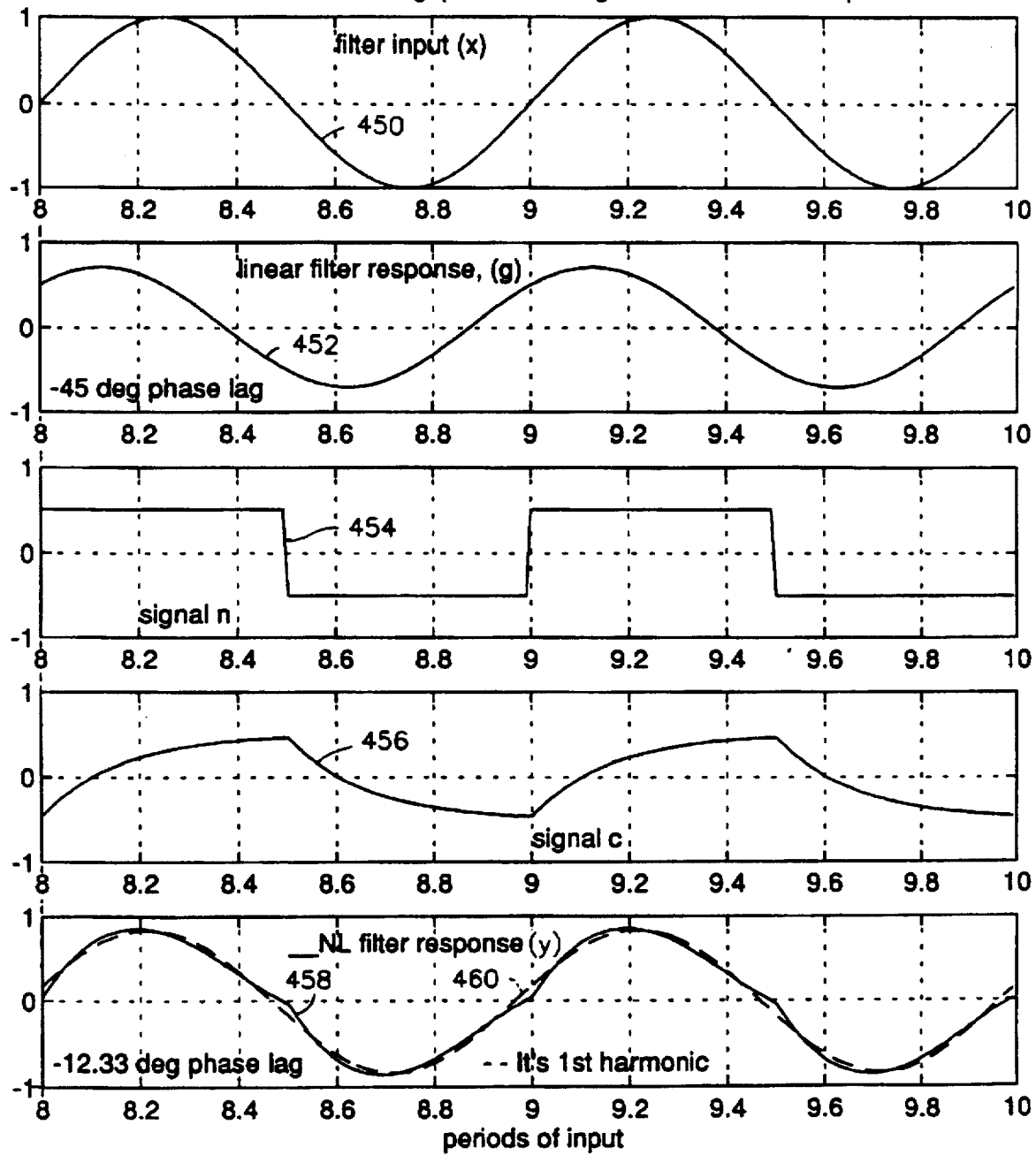
FIG. 18 shows five time graphs of various signals of a non-linear 10 Hz first order high pass filter, in response to a 10 Hz sinusoidal input, in accordance with the present invention.

Referring now to FIG. 18, a series of time graphs are shown for a given input signal x showing the time response of the signals g,n,c,y in FIG. 1. In particular, when G(s) is the filter of Eq. 4 and the input signal x is a 10 Hz input signal as indicated by a curve 450, the time response signal g of the linear filter 10 (FIG. 1) G(s) is indicated by a curve 452 (FIG. 18). The curve 452 of the response g shows a phase lead of 45° and a slightly attenuated amplitude as compared to the curve 450 of the input signal x.

The signal n provided by the zero-cross, sample and hold logic 16 (FIG. 1) is indicated by a square wave curve 454 (FIG. 18). The calculation of the signal n by the logic 16 is done in the same way as described hereinbefore for FIG. 6. As discussed hereinbefore, the signal n exhibits a square wave type function which crosses zero at the same time and in the same direction as the filter input x and has an amplitude equal to the value of g at that time, as indicated by the curve 454.

The input n is fed to the complementary linear filter function 20 (FIG. 1) which, for G(s) being the first order high pass filter of Eq. 4, the transfer function for the complementary linear filter 20 is a first order lag filter (1–G(s)). The response c of the complementary linear filter 20 is indicated by a curve 456 (FIG. 18).

The resultant output signal y of the nonlinear filter 8 is indicated by a curve 458 which is the sum of the signals g and c. The first harmonic of the nonlinear filter response curve 458 is indicated by a curve 460. Also, the resultant change in phase shift is from a linear filter response g of 45° phase lead (–45° lag) to a nonlinear filter response y of 12.33° phase lead (–12.33 lag), thereby reducing the phase shift of the overall filter response by about 33° (45°–12°).

Figure 19:
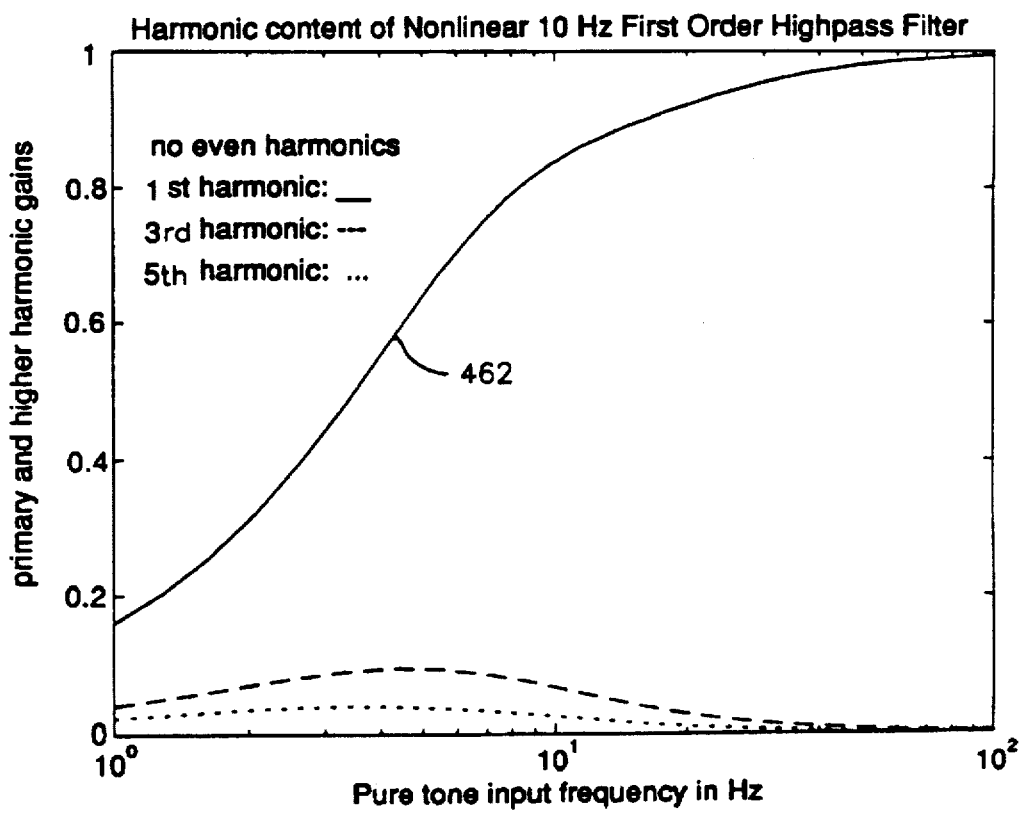
FIG. 19 is a graph of the harmonic content of a non-linear 10 Hz first order high pass filter, in accordance with the present invention.

Referring now to FIG. 19, the nonlinear nature of the filter response curve 458 of FIG. 18 contains higher harmonics in addition to the first harmonic curve 460 shown in FIG. 18. The amplitudes of the first, third, and fifth harmonics of the output signal y for a pure sinusoidal input are shown in FIG. 19. No even harmonics exist in the output signal 458. The first harmonic is the same as that shown in the magnitude plot of FIG. 16, curve 402, but on a linear vertical scale.

Second Order Bandpass Filter

Referring now to FIGS. 20–23, the response of the non-linear filter 8 (FIG. 1) of the present invention is shown for G(s) being a second order bandpass filter with the following transfer function:

$$G(s)=[s^2/(s^2+2\xi\omega_{n1}s+\omega_{n1}^2)]*[\omega_{n2}^2/(s^2+2\xi\omega_{n2}s\omega_{n2}^2)] \qquad [\text{Eq. 5}]$$

where $\xi=0.6$ and $\omega_{n1}=5\pi$ rad/sec or $f_{n1}=2.5$ Hz
and $\omega_{n2}=80\pi$ rad/sec or $f_{n2}=40$ Hz.

Figure 20:
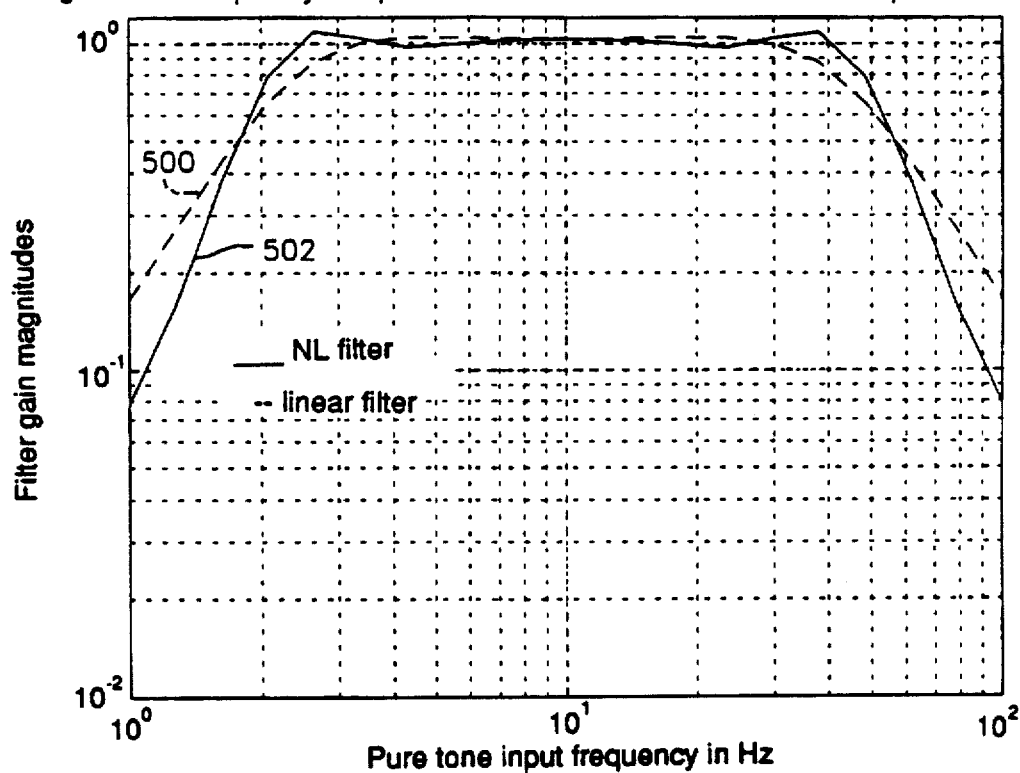
FIG. 20 is a graph of the magnitude frequency response for linear and non-linear 2.5–40 Hz second order bandpass filters, in accordance with the present invention.

In particular, referring now to FIG. 20, the magnitude frequency response of the prior art linear filter G(s) is shown by a dashed curve 500 and the magnitude frequency response of the first harmonic of the non-linear reduced phase-shift filter 8 (analogy of the linear filter) of FIG. 1 of the present invention is shown by a curve 502, which shows a very similar magnitude response profile to that of the linear filter response curve 500.

Figure 21:
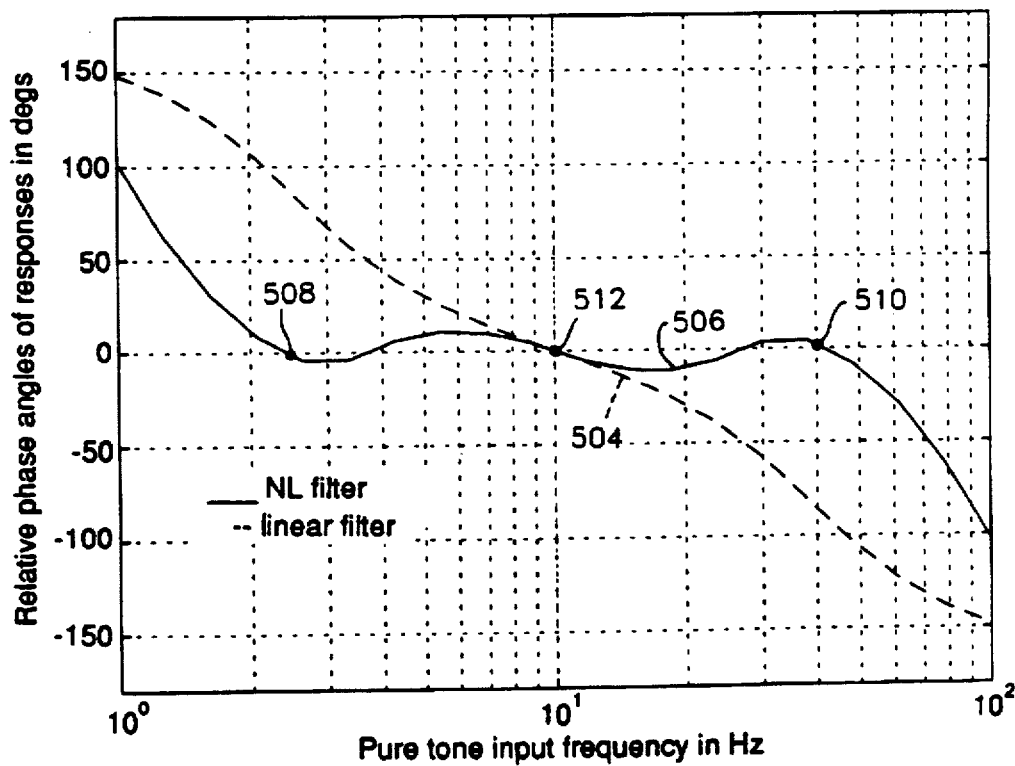
FIG. 21 is a graph of the phase frequency response for linear and non-linear 2.5–40 Hz second order bandpass filters, in accordance with the present invention.

Referring to FIG. 21, the phase frequency response for the prior art linear filter G(s) is shown by a dashed curve 504 and the phase frequency response of the first harmonic of the nonlinear reduced phase-shift filter of FIG. 1 of the present invention is shown by a curve 506. As can be seen by comparison of the curves 504,506, the present invention reduces the phase shift from that exhibited by the linear prior art filter.

In particular, over the frequency range of the pass band, i.e., 2.5–40 Hz, the phase response of the present invention is substantially flat, as can be seen by the curve 506 between the points 508 and 510 on the curve 506. Also, at the center of the passband the phase response is 0° which is identically equal to that of the linear response as indicated by a point 512 where the two curves 504,506 intersect.

Figure 22:
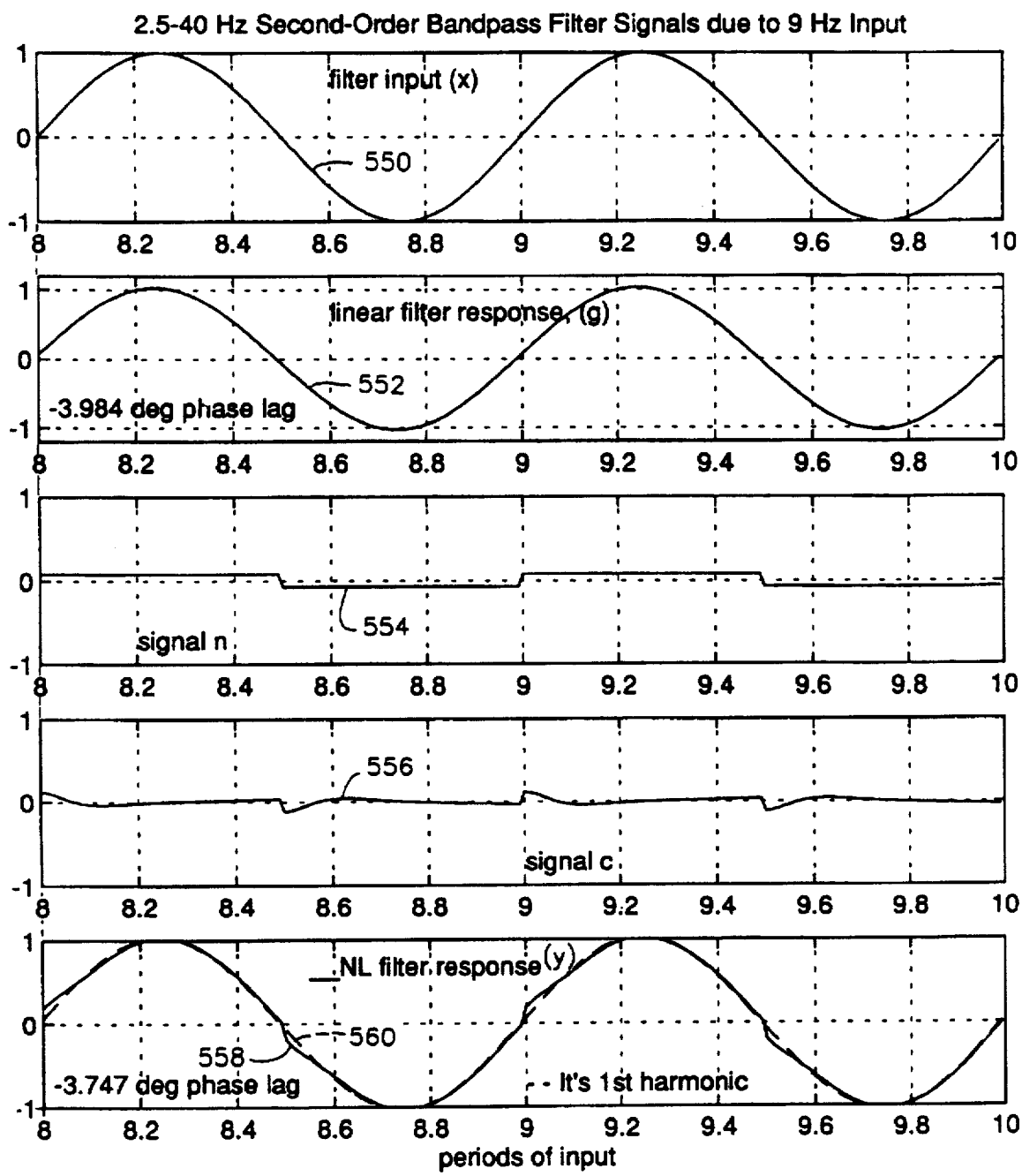
FIG. 22 shows five time graphs of various signals of a non-linear 2.5–40 Hz second order bandpass filter, in response to a 9 Hz sinusoidal input, in accordance with the present invention.

Referring now to FIG. 22, a series of time graphs are shown for a given input signal x showing the time response of the signals g,n,c,y in FIG. 1. In particular, when G(s) is the filter of Eq. 5 and the input signal x is a 9 HZ input signal as indicated by a curve 550, the time response signal g of the linear filter 10 (FIG. 1) G(s) is indicated by a curve 552 (FIG. 14). The curve 552 of the response g shows a phase lead of 3.98° (–3.98 lag) and a slightly attenuated amplitude as compared to the curve 550 of the input signal x.

The signal n provided by the zero-cross, sample and hold logic 16 (FIG. 1) is indicated by a square wave curve 554 (FIG. 14). The calculation of the signal n by the logic 16 is done in the same way as described hereinbefore for FIG. 6. As discussed hereinbefore, the signal n exhibits a square wave type function which crosses zero at the same time and in the same direction as the filter input x and has an amplitude equal to the value of g at that time, as indicated by the curve 554.

The input n is fed to the complementary linear filter function 20 (FIG. 1) which, for G(s) being the first second order bandpass filter of Eq. 5, the transfer function for the complementary linear filter 20 is a second order band reject filter (1–G(s)). The response c of the complementary linear filter 20 is indicated by a curve 456.

The resultant output signal y of the nonlinear filter 8 is indicated by a curve 558 which is the sum of the signals g and c. The first harmonic of the nonlinear filter response curve 558 is indicated by a curve 560. Also, the resultant change in phase shift is from a linear filter response g of 3.984° phase lead (–3.984 lag) to a nonlinear filter response y of 3.747° phase lead (–3.747 lag). In this case, because the input frequency of 9 Hz is close to the frequency at which the input and output of the linear filter function phase shift is substantially zero, the correction required is minimal and as such, the signal 554 has a very low amplitude and the signal 558 has very slight minor non-linearities exhibited by it.

Figure 23:
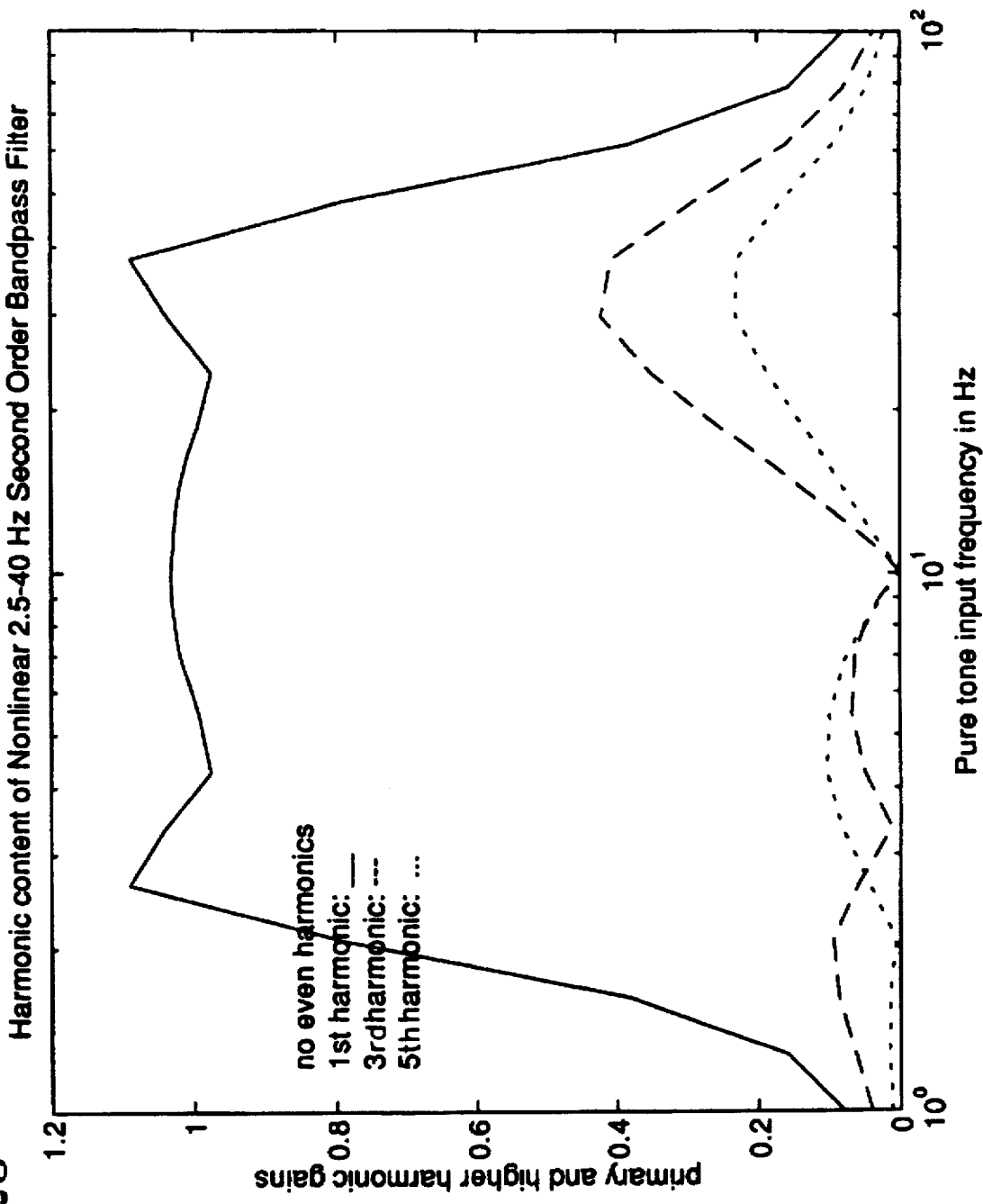
FIG. 23 is a graph of the harmonic content of a non-linear 2.5–40 Hz second order bandpass filter, in accordance with the present invention.

Referring now to FIG. 23, the nonlinear nature of the filter response curve 558 of FIG. 22 contains higher harmonics in addition to the first harmonic curve 560 shown in FIG. 22. The amplitudes of the first, third, and fifth harmonics of the output signal y for a pure sinusoidal input are shown in FIG. 23. No even harmonics exist in the output signal 558. The first harmonic is the same as that shown in the magnitude plot of FIG. 19, curve 502, but on a linear vertical scale.

It should be understood, as illustrated by the time responses of the different filters shown herein, that abrupt changes in the signal n (due to the square wave nature of the signal n), whenever the input x crosses zero, add higher harmonics to the filter output signal y. In some case, the complementary filter 20 (1–G(s)) will filter out these higher harmonics because the response to the step input n will be to attenuate higher frequencies. This will occur if complementary filter gain or frequency response magnitude decreases or attenuates high frequencies, which is the case if the original linear filter G(s) approaches 1 or a constant (at high frequency). Therefore, the output signal y will exhibit fewer higher harmonics when G(s) is a notch or a highpass filter than if the filter G(s) is a lowpass or bandpass filter. This is shown by the time plots discussed hereinbefore.

In many applications, the presence of higher harmonics will not compromise system performance because in feedback control systems the natural dynamics of the system being controlled will attenuate the higher harmonics.

Figure 24:
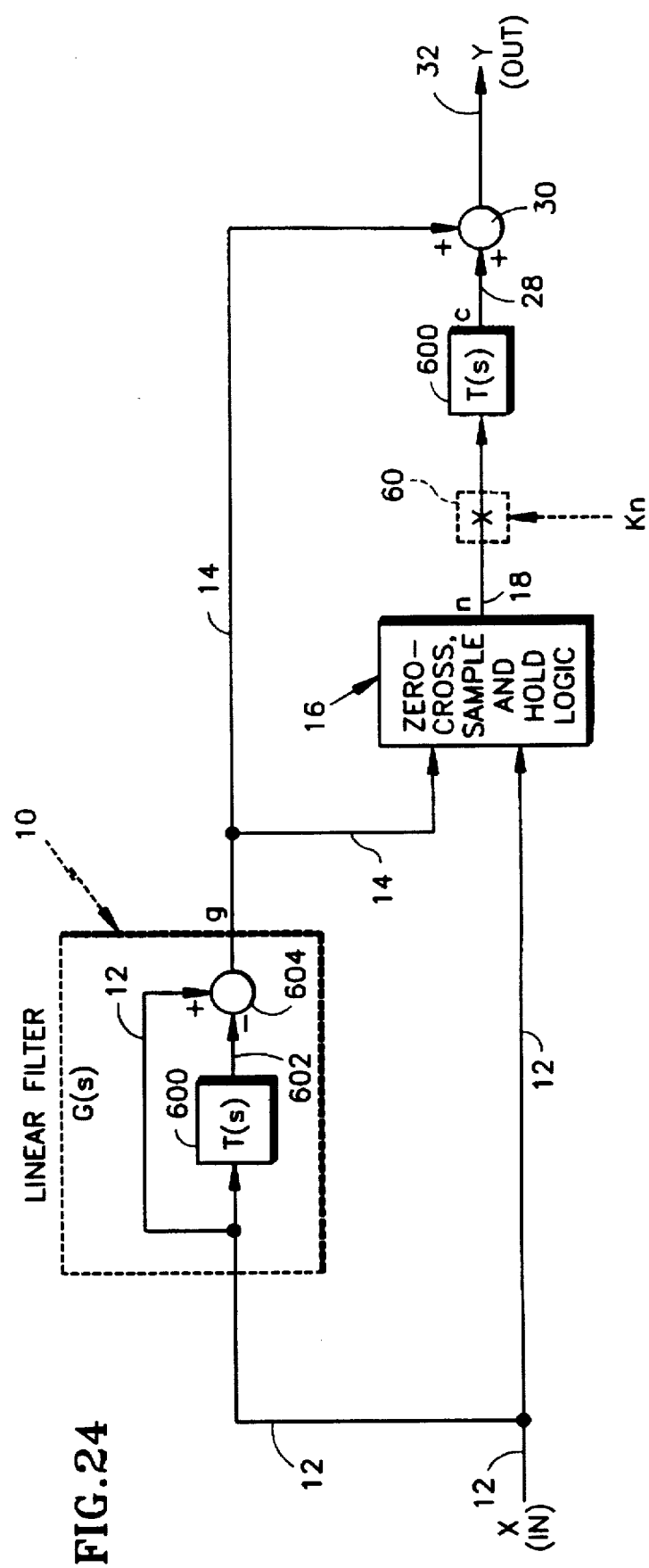
FIG. 24 is a schematic block diagram of an alternative embodiment of a non-linear reduced phase-shift filter, in accordance with the present invention.

Referring now to FIG. 24, when the transfer function G(s) has the same order in both the numerator and the denominator and both approach the same value at high frequencies (i.e., the transfer function has a value of one at high frequencies), the transfer function G(s) may be rewritten in the form:

$$G(s)=1-T(s)$$

where T(s) is a transfer function having a reduced order numerator. In that case, the block diagram of FIG. 1 may be simplified as shown in FIG. 24. In particular, within the linear filter logic 10, the input signal x on the line 12 is fed to reduced order linear filter logic 600 having the transfer function T(s). The logic 600 provides a signal on a line 602 to the negative input of a summer 604. The input signal x on the line 12 is also fed to a positive input of the summer 604. The summer provides the signal g (response to the linear filter G(s)) on the line 14. It should be understood that the linear filter logic 10 may be implemented as the transfer function G(s) if desired. However, using the 1–T(s) form allows for a lower order transfer function to be used for this logic.

Also, the complementary filter transfer function 1–G(s) is simplified to T(s) when the substitution G(s)=1–T(s) is made, i.e., 1–(1–T(s))=T(s). Accordingly, in FIG. 24, the complementary filter logic 20 is simplified to merely the reduced order transfer function T(s) logic 600.

For example, for a notch filter having a transfer function:

$$G(s)=(s^2+2\xi_1\omega_n s+\omega_n^2)/(s^2+2\xi_2\omega_n s+\omega_n^2)$$

G(S) may be re-written as follows:

$$G(s)=1-2\xi_3\omega_n s/(S^2+2\xi_2\omega_n s+\omega_n^2)=1-T(s)$$

where $\xi_1=\xi_2-\xi_3$ and $T(s)=2\xi_3\omega_n s/(s^2+2\xi_2\omega_n s+\omega_n^2)$.

Thus, T(s) has a numerator having one lower order (i.e., power of s) than the denominator, which may likely be simpler to implement in hardware and/or software than the second order numerator of G(s). Such a simplification may be made with any transfer function where the numerator and denominator have the same order (highest power of s), e.g., high pass, integral-lead, notch, etc. High frequency gains other than one may be used if desired (as discussed hereinafter).

Alternatively, as discussed hereinbefore with FIG. 1, the signal n may be multiplied by the gain Kn as indicated by the optional multiplier 60. In that case, the value of Kn is set so as to set the amplitude of the square wave signal n to be a predetermined ratio of the signal g at the sample time. This allows the amount of phase shift reduction to be adjusted (decreased) and the amount of non-linearity (harmonic distortion) of the output signal to be decreased. For example, if Kn=0.5, there would be less phase shift reduction but the output signal would exhibit decreased higher harmonic amplitudes.

Further, the optional gain Kn discussed in FIGS. 1 and 24 may instead be placed on the line 14 between the linear filter block 10 and the zero-cross, sample and hold logic 16, so as to gain shift the signal g prior to sampling by the logic 16, if desired.

Also, it should be understood that the nonlinear filter of the present invention does not by definition have all the properties of a linear filter. If it did, it would be linear and would have the relatively large phase shifts the nonlinear filter of the invention is intended to reduce. The nonlinearity of the nonlinear filter consists of using the zero crossings of one signal, i.e., the input signal x, to determine when to sample another signal, i.e., the output g of the linear filter. Since the zero crossings of x are independent of the scale or amplitude of the input signal x, the nonlinear filter retains the linear property of homogeneity, i.e., the filter gain does not vary if the input signal amplitude changes.

However, the property of superposition is not retained. In particular, if two different input signals x1,x2 are added together and then fed into the non-linear filter, the output of the filter will not be the same as if the signals x1,x2 are fed individually to two identical non-linear filters and the outputs summed. Thus, the filtered output of the sum of the two input signals (e.g., x1 and x2) will not be equal to the sum of the individually filtered input signals x1,x2. Because the zero crossings of the sum of the two input signals x1,x2 may be different from the zero crossings of the two separate input signals x1,x2, the output response y of the non-linear filter will also be different. This occurs because the timing of when the input signal x crosses zero determines when the signal g is sampled and as such determines the response y of the non-linear filter.

Thus, Bode magnitude and phase frequency response plots (such as those shown herein) provide precise response information only for pure tone sinusoidal input signals, not for a signal having a plurality of frequencies. Accordingly, one cannot use such a frequency response plot to determine how the non-linear filter treats all the frequencies of a complex input signal having a plurality of frequencies. As a result, nonlinear simulations may need to be used to analyze the filter performance of the present invention, as with any nonlinear function. Non-linear simulations are commonly used to analyze systems because most systems have non-linear components therein. Also, there is typically a dominant frequency which is desired to be filtered by the filter. Thus, the frequency response plots may be used to approximate the ability of the non-linear filter to filter that frequency, and then use a non-linear simulation to obtain more specific performance information.

Also, it should be understood that in addition to the transfer functions described herein for use with the invention, any other linear transfer function not described herein may be used if desired. Further, any of the filter functions described herein (or any other linear transfer function not described herein) may be grouped together as a single transfer function G(s). For example, more than one first order lowpass or more than one second order lowpass, more than one notch, etc., or a combination of one or more of any of the functions described herein may be used as the function G(s).

Also, it should be understood that the break frequencies, notch frequencies, and damping ratios described herein are used merely for illustrative purposes, and that the invention will work equally well with other break frequencies, notch frequencies, and damping ratios.

Further, as with any frequency filter, it may be desirable for the input signal x to have a zero average value or dc level for the desired frequency components to be filtered as expected. In feedback control system design it is known how to provide such an input signal characteristic, e.g., a.c. couple or high-pass-filter the input signal.

Also, it should be understood that the gains of the various filters of the present invention in the passband frequency range and/or at high frequencies (such as for the reduced order transfer function of FIG. 24) can be made other than one by scaling both the linear filter transfer function and the corresponding complementary filter transfer function. Further, in general, the filter gains may be set to any value by scaling both the linear filter transfer function and the corresponding complementary filter transfer function.

Although the invention has been described and illustrated with respect to the exemplary embodiments thereof, it should be understood by those skilled in the art that the foregoing and various other changes, omissions and additions may be made without departing from the spirit and scope of the invention.

We claim:

1. A reduced phase-shift nonlinear filter, comprising:
a linear filter responsive to a filter input signal and having a linear transfer function, which provides a linear filtered signal;
zero-cross logic responsive to said filter input signal and said linear filtered signal, which provides a square wave signal which crosses zero at the same time and in the same direction as said filter input signal and has an amplitude proportional to the magnitude of said linear filtered signal when said filter input signal crosses zero;

a complementary filter responsive to said square wave signal and having a complementary transfer function which is complementary to said linear transfer function, which provides a complementary filtered signal; and said complementary filtered signal and said linear filtered signal being added together to provide a filter output signal which exhibits less phase shift between said filter input signal and said filter output signal over predetermined frequency bands than that of said linear transfer function.

2. The filter of claim 1 wherein said linear transfer function comprises a numerator polynomial and a denominator polynomial both having the same order and said complementary transfer function comprises a reduced-order transfer function which has a numerator polynomial of a lower order than said denominator polynomial.

3. The filter of claim 1 wherein said zero-cross logic comprises logic which sets said square wave signal amplitude proportional to the absolute value of said linear filtered signal when said filter input signal crosses zero from negative to positive and sets said square wave signal amplitude proportional to the negative of the absolute value of said linear filtered signal when said filter input signal crosses zero from positive to negative.

4. The filter of claim 1 wherein said linear filter is a low pass filter.

5. The filter of claim 1 wherein said linear transfer function is equal to a second order low pass filter.

6. The filter of claim 1 wherein said linear transfer function is equal to a notch filter.

7. The filter of claim 1 wherein said linear transfer function is equal to a second order notch filter.

8. The filter of claim 1 wherein said linear transfer function is equal to a highpass filter.

9. The filter of claim 1 wherein said linear transfer function is equal to a second order highpass filter.

10. The filter of claim 1 wherein said linear transfer function is equal to a bandpass filter.

11. The filter of claim 1 wherein said linear transfer function is equal to a second order bandpass filter.

12. The filter of claim 1 wherein said amplitude of said square wave signal is equal to the magnitude of said linear filtered signal when said filter input signal crosses zero.

13. A reduced phase-shift nonlinear filter, comprising:

linear filter means responsive to a filter input signal and having a linear transfer function, for providing a linear filtered signal;

zero-cross means responsive to said filter input signal and said linear filtered signal for providing a square wave signal which crosses zero at the same time and in the same direction as said filter input signal and has an amplitude proportional to the magnitude of said linear filtered signal when said filter input signal crosses zero;

complementary filter means responsive to said square wave signal and having a complementary transfer function which is complementary to said linear transfer function, for providing a complementary filtered signal; and summing means responsive to said complementary filtered signal and said linear filtered signal for adding together said complementary filtered signal and said linear filtered signal and for providing a filter output signal which exhibits less phase shift between said filter input signal and said filter output signal over predetermined frequency bands than that of said linear transfer function.

14. The filter of claim 13 wherein said linear transfer function comprises a numerator polynomial and a denominator polynomial both having the same order and said complementary transfer function comprises a reduced-order transfer function which has a numerator polynomial of a lower order than said denominator polynomial.

15. The filter of claim 13 wherein said zero-cross means comprises means for setting said square wave signal amplitude proportional to the absolute value of said linear filtered signal when said filter input signal crosses zero from negative to positive, and for setting said square wave signal amplitude proportional to the negative of the absolute value of said linear filtered signal when said filter input signal crosses zero from positive to negative.

16. The filter of claim 13 wherein said linear filter is a low pass filter.

17. The filter of claim 13 wherein said linear filter is a second order low pass filter.

18. The filter of claim 13 wherein said linear filter is a notch filter.

19. The filter of claim 13 wherein said linear filter is a second order notch filter.

20. The filter of claim 13 wherein said linear filter is a highpass filter.

21. The filter of claim 13 wherein said linear filter is a second order highpass filter.

22. The filter of claim 13 wherein said linear filter is a bandpass filter.

23. The filter of claim 13 wherein said linear filter is a second order bandpass filter.

24. The filter of claim 13 wherein said amplitude of said square wave signal is equal to the magnitude of said linear filtered signal when said filter input signal crosses zero.

25. A method for filtering, comprising:

filtering a filter input signal through a linear transfer function and providing a linear filtered signal;

providing a square wave signal which crosses zero at the same time and in the same direction as said filter input signal and has an amplitude proportional to the magnitude of said linear filtered signal when said filter input signal crosses zero;

filtering said square wave signal through a complementary filter having a complementary transfer function which is complementary to said linear transfer function, and providing a complementary filtered signal; and summing said complementary filtered signal and said linear filtered signal and providing a filter output signal which exhibits less phase shift between said filter input signal and said filter output signal over predetermined frequency bands than that of said linear transfer function.

26. The method of claim 25 wherein said linear transfer function comprises a numerator polynomial and a denominator polynomial both having the same order and said complementary transfer function comprises a reduced-order transfer function which has a numerator polynomial of a lower order than said denominator polynomial.

27. The method of claim 25 wherein said step of providing comprises setting said square wave signal amplitude proportional to the absolute value of said linear filtered signal when said filter input signal crosses zero from negative to positive, and setting said square wave signal amplitude proportional to the negative of the absolute value of said linear filtered signal when said filter input signal crosses zero from positive to negative.

28. The method of claim 25 wherein said linear filter is a low pass filter.

29. The method of claim 25 wherein said linear filter is a second order low pass filter.

30. The method of claim 25 wherein said linear filter is a notch filter.

31. The method of claim 25 wherein said linear filter is a second order notch filter.

32. The method of claim 25 wherein said linear filter is a highpass filter.

33. The method of claim 25 wherein said linear filter is a second order highpass filter.

34. The method of claim 25 wherein said linear filter is a bandpass filter.

35. The method of claim 25 wherein said linear filter is a second order bandpass filter.

36. The method of claim 25 wherein said amplitude of said square wave signal is equal to the magnitude of said linear filtered signal when said filter input signal crosses zero.

* * * * *

UNITED STATES PATENT AND TRADEMARK OFFICE
CERTIFICATE OF CORRECTION

PATENT NO. : 5,694,077
DATED : December 2, 1997
INVENTOR(S) : James W. Fuller

It is certified that error appears in the above-identified patent and that said Letters Patent is hereby corrected as shown below:

Col. 15
In Claim 5, lines 1-2, change "transfer function is equal to" to --filter is--;
In Claim 6, lines 1-2, change "transfer function is equal to" to --filter is--;
In Claim 7, lines 1-2, change "transfer function is equal to" to --filter is--;
In Claim 8, lines 1-2, change "transfer function is equal to" to --filter is--;
In Claim 9, lines 1-2, change "transfer function is equal to" to --filter is--;
In Claim 10, lines 1-2, change "transfer function is equal to" to --filter is--;
In Claim 11, lines 1-2, change "transfer function is equal to" to --filter is--.

Signed and Sealed this

Twenty-eighth Day of April, 1998

Attest:

BRUCE LEHMAN

*Attesting Officer*  *Commissioner of Patents and Trademarks*